US011929721B2

(12) United States Patent
Tanaka et al.

(10) Patent No.: US 11,929,721 B2
(45) Date of Patent: Mar. 12, 2024

(54) POWER AMPLIFIER MODULE

(71) Applicant: Murata Manufacturing Co., Ltd., Kyoto (JP)

(72) Inventors: Satoshi Tanaka, Kyoto (JP); Yoshiaki Sukemori, Kyoto (JP); Takeshi Kogure, Kyoto (JP); Shohei Imai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 407 days.

(21) Appl. No.: 17/223,384

(22) Filed: Apr. 6, 2021

(65) Prior Publication Data
US 2021/0313938 A1 Oct. 7, 2021

(30) Foreign Application Priority Data

Apr. 7, 2020 (JP) .................................. 2020-069081
Dec. 24, 2020 (JP) .................................. 2020-215404

(51) Int. Cl.
*H03F 3/24* (2006.01)
*H03F 1/02* (2006.01)
*H03F 3/195* (2006.01)
*H03F 3/68* (2006.01)

(52) U.S. Cl.
CPC ........... *H03F 3/245* (2013.01); *H03F 1/0288* (2013.01); *H03F 3/195* (2013.01); *H03F 3/68* (2013.01); *H03F 2200/451* (2013.01)

(58) Field of Classification Search
CPC ........ H03F 3/245; H03F 1/0288; H03F 3/195; H03F 3/68; H03F 2200/451

USPC ...................................................... 330/124 R
See application file for complete search history.

(56) References Cited

U.S. PATENT DOCUMENTS

| 5,568,086 | A | 10/1996 | Schuss et al. |
| 7,427,895 | B1 | 9/2008 | Okubo et al. |
| 10,484,024 | B2 | 11/2019 | Takenaka |
| 10,855,318 | B2 | 12/2020 | Takenaka |
| 2004/0113698 | A1 | 6/2004 | Kim et al. |
| 2015/0028948 | A1* | 1/2015 | Staudinger ............ H03F 1/0288 330/251 |

(Continued)

FOREIGN PATENT DOCUMENTS

| JP | H08-330873 A | 12/1996 |
| JP | 2007-116259 A | 5/2007 |

(Continued)

*Primary Examiner* — Hafizur Rahman
(74) *Attorney, Agent, or Firm* — Pearne & Gordon LLP

(57) ABSTRACT

A power amplifier module includes a first amplifier, a power splitter, a second amplifier, a third amplifier, a phase shifter, a combining unit, and a controller. The first amplifier amplifies a first signal and outputs a second signal. The power splitter splits the second signal into a third signal and a fourth signal. The second amplifier amplifies the third signal and outputs a fifth signal. The third amplifier amplifies the fourth signal and outputs a sixth signal. The phase shifter receives the fifth signal and shifts a phase of the fifth signal. The combining unit combines the fifth signal having the phase shifted by the phase shifter and the sixth signal and outputs an amplified signal of the second signal. The controller outputs a first control signal for controlling a power level of the sixth signal output from the third amplifier.

20 Claims, 20 Drawing Sheets

(56) References Cited

U.S. PATENT DOCUMENTS

2017/0019071 A1* 1/2017 Kobayashi ............ H03F 1/0288
2019/0068129 A1* 2/2019 Ito ........................ H03F 3/191

FOREIGN PATENT DOCUMENTS

JP      2012-049858 A    3/2012
KR    10-2004-0043306 A  5/2004

* cited by examiner

POWER AMPLIFIER MODULE

CROSS REFERENCE TO RELATED APPLICATION

This application claims priority from Japanese Patent Application No. 2020-069081 filed on Apr. 7, 2020 and Japanese Patent Application No. 2020-215404 filed on Dec. 24, 2020. The contents of these applications are incorporated herein by reference in its entirety.

BACKGROUND

The present disclosure relates to a power amplifier module. A Doherty amplifier is a highly efficient power amplifier. A Doherty amplifier generally includes a carrier amplifier and a peaking amplifier connected in parallel with each other. The carrier amplifier operates irrespective of a power level of an input signal. The peaking amplifier is in an off state when the power level of the input signal is low and is in an on state when the power level of the input signal is high. When the power level of the input signal is high, the carrier amplifier operates while being kept saturated at a saturated output power level. In this manner, the Doherty amplifier can have improved efficiency compared with efficiency of an ordinary power amplifier.

The related art is described in, for example, Japanese Unexamined Patent Application Publication No. 8-330873.

As described above, in the Doherty amplifier, the peaking amplifier is caused to operate at a timing when the carrier amplifier is almost saturated. The peaking amplifier operates at an appropriate timing as a result of optimization of a class-C bias level. The class-C bias level is adjusted by a region where the idle current of the peaking amplifier is zero. The Doherty amplifier, however, requires detailed bias level settings because of variations in characteristics of transistors and characteristics of elements of a matching circuit. The Doherty amplifier also requires introduction of a predistortion system for compensating for distortion characteristics.

BRIEF SUMMARY

The present disclosure provides a power amplifier module that is less influenced by characteristics of transistors and reduces variations in characteristics.

According to embodiments of the present disclosure, a power amplifier module includes a first amplifier, a power splitter, a second amplifier, a third amplifier, a phase shifter, a combining unit, and a controller. The first amplifier amplifies a first signal and outputs a second signal. The power splitter splits the second signal into a third signal and a fourth signal. The second amplifier amplifies the third signal and outputs a fifth signal. The third amplifier amplifies the fourth signal and outputs a sixth signal. The phase shifter receives the fifth signal and shifts a phase of the fifth signal. The combining unit combines the fifth signal having the phase shifted by the phase shifter and the sixth signal and outputs an amplified signal of the second signal. The controller outputs, based on an amplitude level of the first signal, a first control signal for controlling a power level of the sixth signal output from the third amplifier.

According to embodiments of the present disclosure, a power amplifier module includes a first amplifier, a power splitter, a second amplifier, a third amplifier, a phase shifter, a combining unit, a signal adjustment unit, and an output circuit. The first amplifier amplifies a first signal and outputs a second signal. The power splitter splits the second signal into a third signal and a fourth signal. The second amplifier amplifies the third signal and outputs a fifth signal. The third amplifier amplifies the fourth signal and outputs a sixth signal. The phase shifter receives the fifth signal and shifts a phase of the fifth signal. The combining unit combines the fifth signal having the phase shifted by the phase shifter and the sixth signal and outputs an amplified signal of the second signal. The signal adjustment unit is between the power splitter and the third amplifier and adjusts a passing amount of the fourth signal. The output circuit outputs, based on a base current of the second amplifier, to the signal adjustment unit, a second control signal for controlling the signal adjustment unit. Based on the second control signal, the signal adjustment unit adjusts the passing amount of the fourth signal.

According to the embodiments of the present disclosure, a power amplifier module that is less influenced by characteristics of transistors and is capable of maintaining linear characteristics can be provided.

Other features, elements, characteristics and advantages of the present disclosure will become more apparent from the following detailed description of embodiments of the present disclosure with reference to the attached drawings.

DETAILED DESCRIPTION

Figure 1:
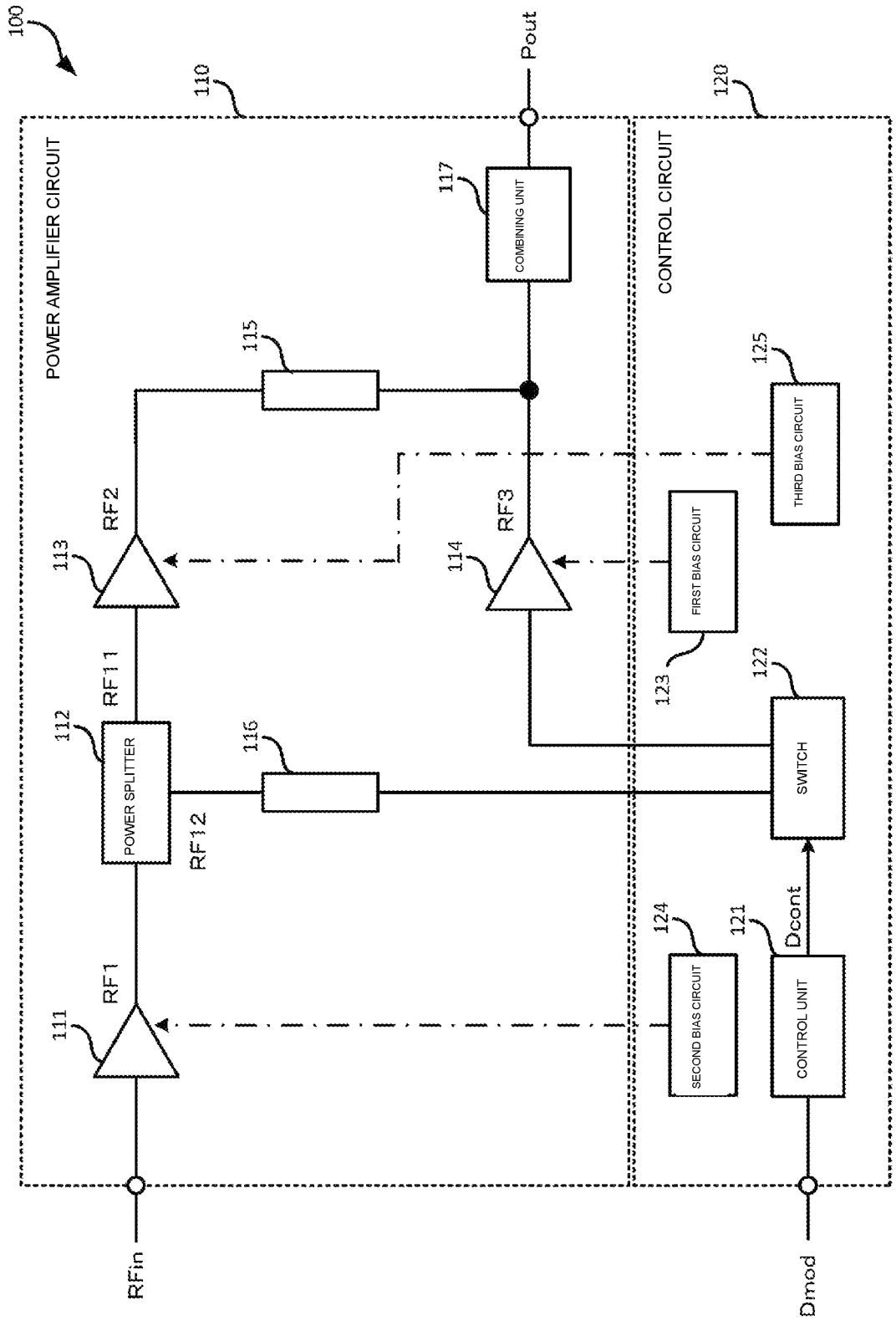
FIG. 1 illustrates an example of a configuration of a power amplifier circuit and a control circuit according to a first embodiment of the present disclosure.
Figure 2:
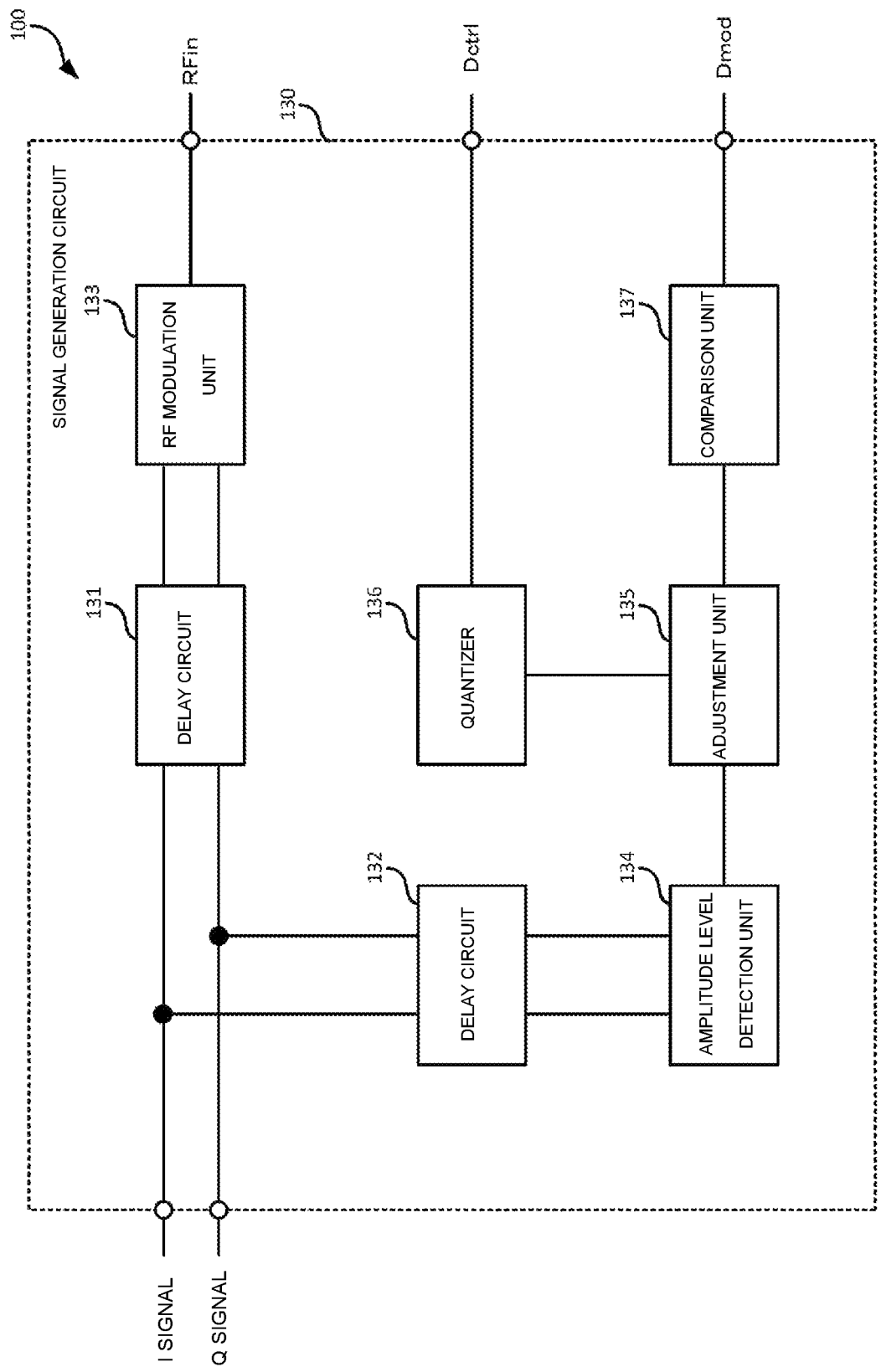
FIG. 2 illustrates an example of a configuration of a signal generation circuit according to the first embodiment of the present disclosure.

Embodiments of the present disclosure will be described below with reference to the accompanying drawings. Circuit elements assigned the same reference sign are identical circuit elements, and duplicate description will be omitted.
Configuration of Power Amplifier Module 100 According to First Embodiment FIGS. 1 and 2 illustrate an example of a configuration of various circuits of a power amplifier module 100 according to a first embodiment of the present disclosure. The power amplifier module 100 is mounted in, for example, a mobile phone and is used for amplifying power of a signal to be transmitted to a base station. For example, the power amplifier module 100 is capable of amplifying power of a signal conforming to communication specifications, such as the 2nd generation mobile communication system (2G), the 3rd generation mobile communication system (3G), the 4th generation mobile communication system (4G), the 5th generation mobile communication system (5G), Long Term Evolution (LTE)-Frequency Division Duplex (FDD), LTE-Time Division Duplex (TDD), LTE-Advanced, and LTE-Advanced Pro. Note that the communication specifications of the signal amplified by the power amplifier module 100 are not limited to these.

The power amplifier module 100 includes, for example, a power amplifier circuit 110, a control circuit 120, and a signal generation circuit 130.
Power Amplifier Circuit 110

For example, the power amplifier circuit 110 amplifies an input signal to have a predetermined amplitude level and outputs the amplified signal.

As illustrated in FIG. 1, the power amplifier circuit 110 includes, for example, a drive-stage amplifier 111, a power splitter 112, a carrier amplifier 113, a peaking amplifier 114, a first phase shifter 115, a second phase shifter 116, and a combining unit 117. The individual components of the power amplifier circuit 110 may be disposed in or on the same substrate or in or on a plurality of substrates. A phase shifter according to embodiments of the present disclosure is desirably a line obtained by intentionally adjusting the length of wiring.

For example, the drive-stage amplifier 111 (first amplifier) amplifies a radio-frequency (RF) signal (hereinafter, referred to as a "signal RFin") input thereto and outputs an amplified signal (hereinafter, referred to as a "signal RF1"). The signal RFin has a frequency of approximately several GHz, for example. The drive-stage amplifier 111 includes, but not limited to, for example, a bipolar transistor, such as a heterojunction bipolar transistor (HBT) or a transistor, such as a metal-oxide-semiconductor field effect transistor (MOSFET). The same applies to the carrier amplifier 113 (described below) and the peaking amplifier 114 (described below).

The power splitter 112, the carrier amplifier 113, the peaking amplifier 114, the first phase shifter 115, the second phase shifter 116, and the combining unit 117 constitute a second-stage amplifier circuit that amplifies the signal RF1 output from the drive-stage amplifier 111.

For example, the power splitter 112 splits the signal RF1 output from the drive-stage amplifier 111 into a signal (hereinafter, referred to as a "signal RF11") to be input to the carrier amplifier 113 and a signal (hereinafter, referred to as a "signal RF12") to be input to the peaking amplifier 114. The signal RF12 comes to have a phase that is delayed relative to the phase of the signal RF11 by approximately 90 degrees as a result of passing through the second phase shifter 116 (described below). The power splitter 112 may be, for example, a distributed constant circuit, such as a coupled-line 3-dB coupler or a Wilkinson power splitter.

For example, the carrier amplifier 113 (second amplifier) amplifies the signal RF11 input thereto and outputs an amplified signal (hereinafter, referred to as a "signal RF2"). A load (not illustrated) is connected to an output side of the carrier amplifier 113. When the peaking amplifier 114 is not in operation, a value of R is obtained. When the peaking amplifier 114 is in operation, a value of R/2 is obtained because of the function thereof. The carrier amplifier 113 is biased in, for example, class A, class AB, or class B. That is, irrespective of the power level of the input signal, such as small instantaneous input power, the carrier amplifier 113 amplifies a signal input thereto and outputs an amplified signal.

For example, the peaking amplifier 114 (third amplifier) amplifies the signal RF12 input thereto through a switch 122 and outputs an amplified signal (hereinafter, referred to as a "signal RF3"). The peaking amplifier 114 is biased in, for example, class A, class AB, class B, or class C. That is, the peaking amplifier 114 amplifies, irrespective of the power level of the input signal, the signal input thereto in response to switching between the on state and the off state of the switch 122 based on a signal Dmod (described below) output from the signal generation circuit 130, and outputs an amplified signal.

The first phase shifter 115 (phase shifter) is, for example, a ¼-wavelength line connected to the output side of the carrier amplifier 113. With this configuration, the load impedance seen at an output end of the carrier amplifier 113 is changed. Consequently, improved efficiency of the carrier amplifier 113 can be implemented.

The second phase shifter 116 is connected to, for example, an input side of the peaking amplifier 114. The second phase shifter 116 is, for example, a ¼-wavelength line.

For example, the combining unit 117 combines the signal RF2 that is output from the carrier amplifier 113 and passes through the first phase shifter 115 and the signal RF3 output from the peaking amplifier 114 and outputs an amplified signal Pout of the signal RFin.
Control Circuit 120

For example, based on a control signal (signal Dmod described below) input thereto from the signal generation circuit 130, the control circuit 120 switches the operation state of at least any of the switch 122, first to third bias circuits 123 to 125, the drive-stage amplifier 111, the carrier amplifier 113, and the peaking amplifier 114. In the first embodiment, the switch 122 included in the control circuit 120 is described; however, the switch 122 may be included in the power amplifier circuit 110. Alternatively, the switch 122 may be independent of the various circuits.

As illustrated in FIG. 1, the control circuit 120 includes, for example, a control unit 121, the switch 122, the first bias circuit 123, the second bias circuit 124, and the third bias circuit 125.

For example, based on a control signal (signal Dmod described below) input thereto from the signal generation circuit 130 (described below), the control unit 121 outputs a control signal (hereinafter, referred to as a "signal Dcont") for controlling at least any of the switch 122, the first bias circuit 123, the second bias circuit 124, the third bias circuit 125, the drive-stage amplifier 111, the carrier amplifier 113, and the peaking amplifier 114. In the first embodiment, the control unit 121 controls the switch 122.

For example, the switch 122 performs switching as to whether to output the signal RF3 from the peaking amplifier 114. In response to input of the signal Dcont from the control unit 121, the switch 122 is turned on. The switch 122 is connected in series with a base of the peaking amplifier 114, for example. In this case, for example, the signal RF12 is input to the peaking amplifier 114 when the switch 122 is in an on state, and the signal RF12 is blocked and is not input to the peaking amplifier 114 when the switch 122 is in an off state. The switch 122 may be connected in series with a collector of the peaking amplifier 114 so that the signal RF3 is not output from the peaking amplifier 114 when the switch 122 is in the off state, for example.

The first bias circuit 123 is, for example, a circuit that supplies a bias current or voltage to the peaking amplifier 114.

The second bias circuit 124 is, for example, a circuit that supplies a bias current or voltage to the drive-stage amplifier 111.

The third bias circuit 125 is, for example, a circuit that supplies a bias current or voltage to the carrier amplifier 113.

Signal Generation Circuit 130

The signal generation circuit 130 is, for example, a circuit that generates, from IQ signals, the signal RFin and a control signal (hereinafter, referred to as a "signal Dmod") to be output to the control circuit 120. IQ signals are modulation signals obtained by modulating an input signal of audio, data, or the like in accordance with a modulation scheme of High-Speed Uplink Packet Access (HSUPA), LTE, or the like. IQ signals are, for example, signals having a frequency of several MHz to several hundreds of MHz.

As illustrated in FIG. 2, the signal generation circuit 130 includes, for example, delay circuits 131 and 132, a RF modulation unit 133, an amplitude level detection unit 134, an adjustment unit 135, a quantizer 136, and a comparison unit 137.

Each of the delay circuits 131 and 132 is, for example, a circuit that delays the IQ signals by a predetermined time to allow a timing when the signal RFin is input to the power amplifier circuit 110 to match a timing when a power supply voltage Vcc corresponding to an amplitude level of the signal RFin is supplied to the power amplifier circuit 110.

For example, the RF modulation unit 133 generates the signal RFin from the IQ signals and outputs the signal RFin. Specifically, for example, the RF modulation unit 133 combines, using a multiplier, an I signal and a carrier signal and combines, using a multiplier, a Q signal and a carrier signal having a phase shifted from the phase of the Q signal by 90 degrees. The RF modulation unit 133 then combines, using a subtracter, the combined signals to generate the signal RFin.

For example, the amplitude level detection unit 134 detects the amplitude level of the IQ signals. That is, the amplitude level detection unit 134 detects the amplitude level of the IQ signals corresponding to the amplitude level of the signal RFin output from the RF modulation unit 133.

The adjustment unit 135 includes, for example, a table for storing a correspondence between the amplitude level of the IQ signals and the level of the power supply voltage Vcc based on gain characteristics of a transistor. Based on the table, the adjustment unit 135 outputs a signal (hereinafter, referred to as a "dynamic control signal") for adjusting a voltage level of the power supply voltage Vcc in accordance with the amplitude level of the IQ signals.

For example, the quantizer 136 converts the high-precision digital dynamic control signal output from the adjustment unit 135 into a low-precision digital signal (with less bits) and outputs a control signal (hereinafter, referred to as a "signal Dctrl") for discretely adjusting the power supply voltage Vcc to a power supply circuit (not illustrated). This allows the power amplifier circuit 110 to perform envelop tracking using a digital signal.

The power supply circuit (not illustrated) generates the power supply voltage Vcc having a level corresponding to the signal Dctrl and supplies the power supply voltage Vcc to the power amplifier circuit 110. For example, the power supply circuit (not illustrated) may include a DC-DC converter that generates the power supply voltage Vcc having a level corresponding to the signal Dctrl from an input voltage (for example, a battery voltage).

The comparison unit 137 is, for example, a comparison circuit that outputs the signal Dmod to the control circuit 120 when the dynamic control signal output from the adjustment unit 135 has a level higher than or equal to a predetermined threshold.

As described above, in the power amplifier module 100, as a result of the control circuit 120 being controlled based on the signal Dmod, the peaking amplifier 114 can be caused to operate at an appropriate timing independently of an influence of characteristics of transistors. Thus, the power amplifier module 100 can achieve high efficiency while reducing manufacturing variations.

As described above, the power amplifier module 100 is not limited to a power amplifier module in which envelope tracking using a digital signal is performed. For example, average power tracking (APT) may be performed, and the employed scheme is not limited.

Power Amplifier Module 200 According to Comparative Example

Figure 11:
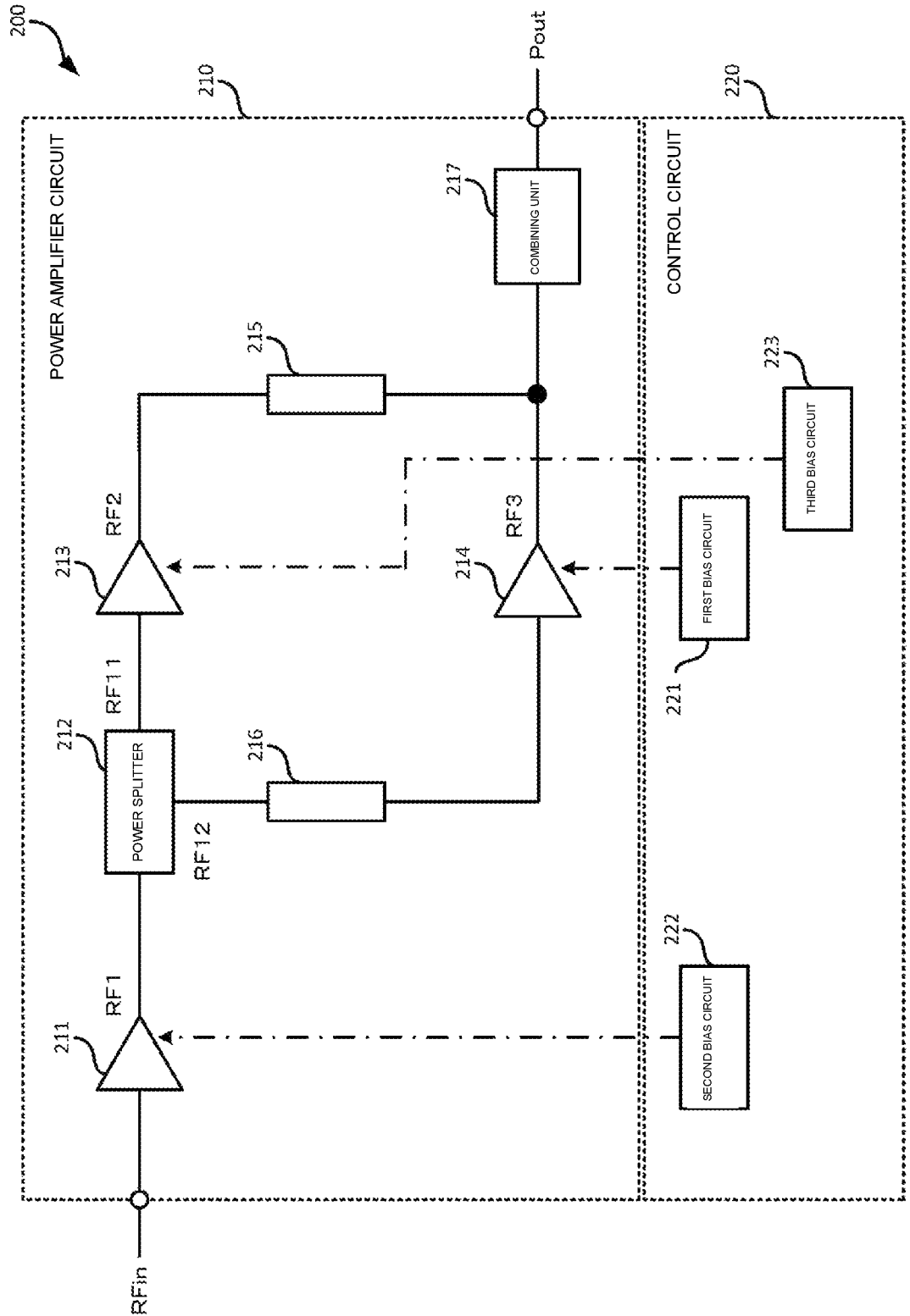
FIG. 11 illustrates an example of a configuration of a power amplifier module according to a comparative example.

A power amplifier module 200 according to a comparative example will be described below with reference to FIG. 11. FIG. 11 illustrates an example of a configuration of the power amplifier module 200 according to the comparative example. The power amplifier module 200 according to the comparative example is presented to promote understanding of the power amplifier module 100 according to the first embodiment.

Compared with the power amplifier module 100, the power amplifier module 200 according to the comparative example does not include, for example, the switch 122 and the control unit 121 that controls the switch 122, as illustrated in FIG. 11. The power amplifier module 200 includes, for example, a distortion compensation unit (not illustrated) in a signal generation circuit (not illustrated).

In the power amplifier module 200 according to the comparative example, a carrier amplifier 213 is biased in class A, class AB, or class B, and a peaking amplifier 214 is biased in class C. That is, in the power amplifier module 200, the carrier amplifier 213 alone operates until the signal RFin having a predetermined amplitude level is input. In response to input of the signal RFin having a level exceeding the predetermined amplitude level, the peaking amplifier 214 starts operating.

The operation timings in the power amplifier module 200 vary depending on characteristics of various elements included in the power amplifier module 200.

Accordingly, for example, the distortion compensation unit (not illustrated) applies a reverse distortion for cancelling non-linear input/output characteristics of the power amplifier module 200 in advance, to the IQ signals input to the signal generation circuit 130 as presented in the example in FIG. 2. Thus, a transmission signal in which the distortion is cancelled can be obtained at an output of the power amplifier module 200.

In contrast, the power amplifier module 100 according to the first embodiment includes the peaking amplifier 114 that is biased in class A, class AB, or class B, and the switch 122 that controls the peaking amplifier 114 based on the amplitude level of the IQ signals as described above. Thus, in the power amplifier module 100, the peaking amplifier 114 is caused to operate at an appropriate timing according to the IQ signals independently of an influence of characteristics of various elements of the power amplifier module 100. Therefore, the power amplifier module 100 is less influenced by variations in analog characteristics caused by manufacturing variations of the power amplifier module, and can implement highly efficient signal amplification.

Operation of Power Amplifier Module 100

Figure 3A:
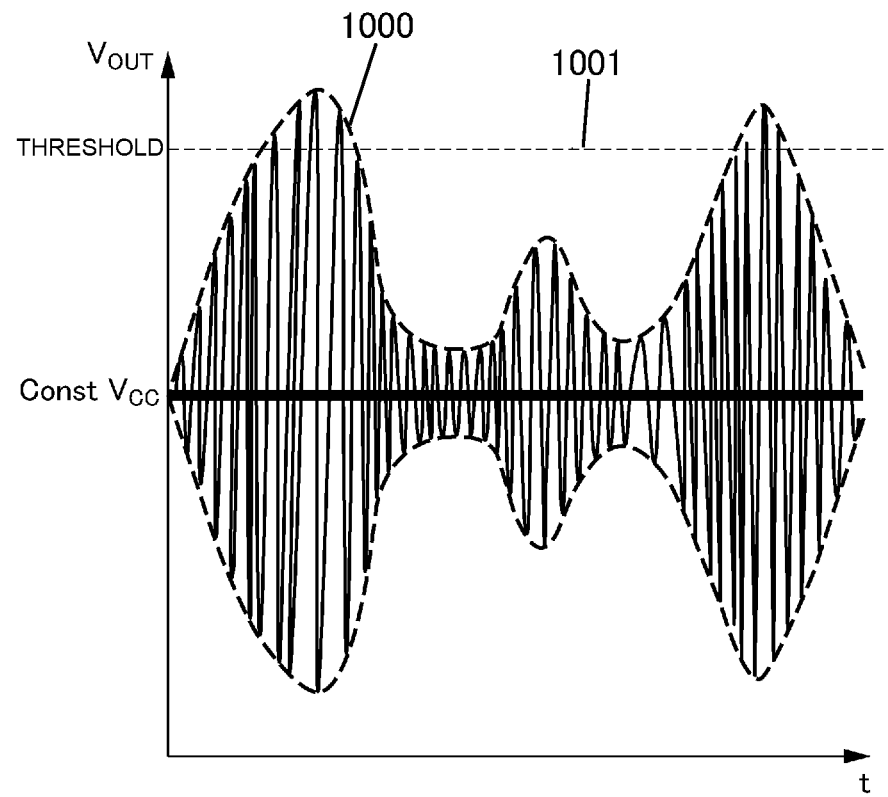
FIGS. 3A and 3B are graphs illustrating a relationship between an amplitude level of a signal RFin and a signal Dmod.
Figure 3B:
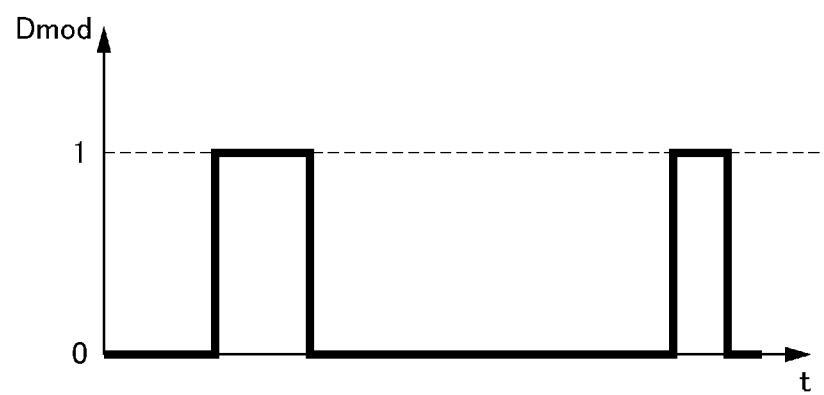
Figure 4:
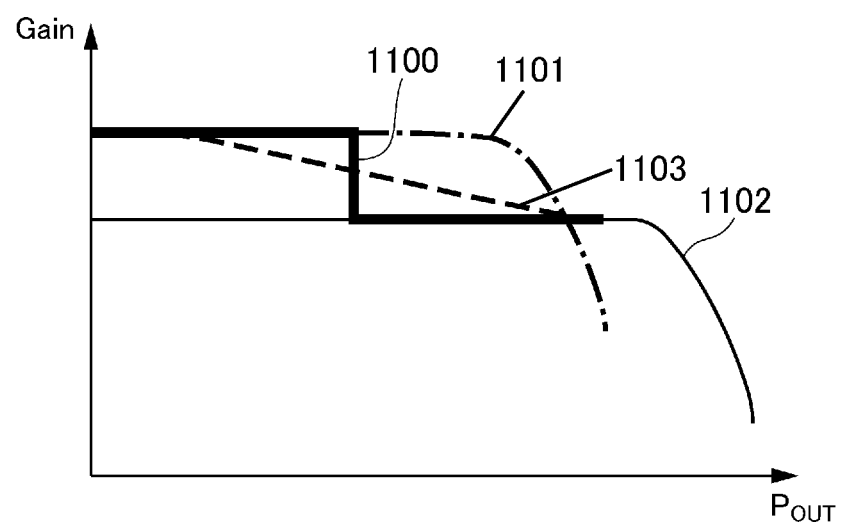
FIG. 4 is a graph illustrating a relationship between a gain and an amplified signal Pout.

An operation of the power amplifier module 100 based on the signal Dmod will be described below with reference to FIGS. 1 to 4. FIGS. 3A and 3B are graphs illustrating a relationship between the amplitude level of the signal RFin and the signal Dmod. FIG. 4 is a graph illustrating a relationship between a gain and the amplified signal Pout.

In FIG. 3A, the horizontal axis denotes elapsed time t, and the vertical axis denotes an amplitude level Vout of the signal RFin. In FIG. 3A, a broken line 1000 denotes the amplitude level Vout of the signal RFin, and a broken line 1001 denotes a threshold.

In FIG. 3B, the horizontal axis denotes elapsed time t, and the vertical axis denotes a binary value of the signal Dmod. In FIG. 3B, the binary value of the signal Dmod indicates "1" when the amplitude level of the signal RFin in FIG. 3A exceeds the threshold, for example.

In FIG. 4, the horizontal axis denotes the amplified signal Pout, and the vertical axis denotes the gain. A thick line 1100 denotes characteristics of the gain of the power amplifier module 100 according to the first embodiment. A dot-dash line 1101 denotes the gain obtained when the carrier amplifier 113 alone is in operation. A line 1102 denotes the gain obtained when the peaking amplifier 114 and the carrier amplifier 113 are in operation simultaneously. A broken line 1103 denotes a process in which the operation of the power amplifier module 200 according to the comparative example shifts from an operation of the carrier amplifier alone to a parallel operation of the carrier amplifier and the peaking amplifier.

As illustrated in FIG. 2, IQ signals are input to the signal generation circuit 130. The IQ signals are input, as the dynamic control signal, to the comparison unit 137 through the delay circuit 132, the amplitude level detection unit 134, and the adjustment unit 135.

In response to input of the dynamic control signal corresponding to the signal RFin illustrated in FIG. 2, the comparison unit 137 outputs the signal Dmod when the amplitude level higher than or equal to the "threshold" illustrated in FIG. 3A is detected. That is, as illustrated in FIG. 3B, the signal generation circuit 130 outputs the signal Dmod in response to input of the IQ signals having an amplitude level of a predetermined magnitude.

As illustrated in FIG. 1, the signal Dmod output from the comparison unit 137 is input to the control unit 121 of the control circuit 120. Based on the signal Dmod, the control unit 121 outputs the signal Dcont for turning on the switch 122.

In response to the switch 122 being turned on based on the signal Dcont, the signal RF12 output from the power splitter 112 is input through the second phase shifter 116 to the peaking amplifier 114 that is biased in class A, class AB, class B, or class C. The peaking amplifier 114 amplifies the signal RF12 and outputs the signal RF3. Consequently, the load impedance seen from the output end of the carrier amplifier 113 decreases. Thus, the carrier amplifier 113 can increase saturated output power and improve the efficiency of the power amplifier circuit 110.

The power amplifier circuit 110 can implement stable on/off switching control for the peaking amplifier 114, and thus can output the signal RF3 at an appropriate timing independently of characteristics of various elements. Consequently, the power amplifier module 100 is less influenced by variations in analog characteristics caused by manufacturing variations of the power amplifier module.

The combining unit 117 combines the signal RF3 and the signal RF2 output from the carrier amplifier 113 and outputs the amplified signal Pout of the signal RFin.

The peaking amplifier 114 is switched by the switch 122 in the power amplifier module 100 according to the first embodiment. Thus, the power amplifier module 100 can maintain linear characteristics (can suppress non-linear characteristics) as indicated by the thick line 1100 in FIG. 4. In contrast, the peaking amplifier 114 biased in class C is caused to operate in the power amplifier module 200 according to the comparative example. Thus, characteristics are non-linear as indicated by the broken line 1103.

Power Amplifier Modules According to Modifications

Power amplifier modules according to modifications will be described with reference to FIGS. 5 to 10. In the modifications, description of configurations common to those of the embodiment described above is omitted, and differences alone will be described. In particular, similar advantages provided by similar configurations are not described individually.

First Modification

Figure 5:
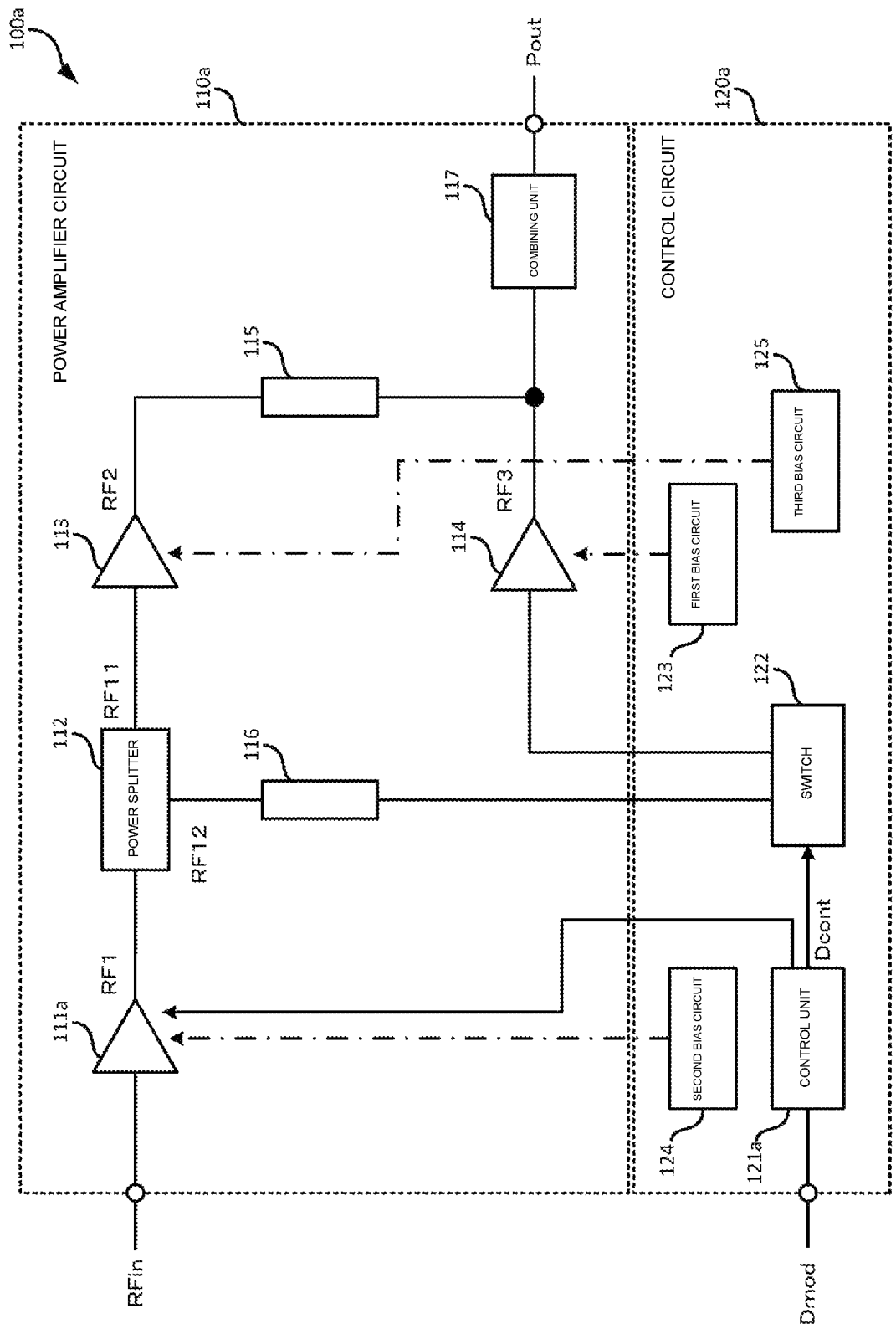
FIG. 5 illustrates an example of a configuration of a power amplifier module according to a first modification.

A configuration of a power amplifier module 100a according to a first modification will be described with reference to FIG. 5. FIG. 5 illustrates an example of a configuration of the power amplifier module 100a according to the first modification. Compared with the power amplifier module 100, a drive-stage amplifier 111a is controlled by a control unit 121a of a control circuit 120a in the power amplifier module 100a as illustrated in FIG. 5.

In the power amplifier module 100a, the signal Dmod is input to the control unit 121a, and the control unit 121a turns on the switch 122. This causes the peaking amplifier 114 and the carrier amplifier 113 to operate in parallel with each other in the power amplifier module 100a.

At this time, the gain of the power amplifier module 100a differs between the state in which the carrier amplifier 113 alone is in operation in a power amplifier circuit 110a and the state in which the carrier amplifier 113 and the peaking amplifier 114 are in operation in the power amplifier circuit 110a. That is, non-linear characteristics of the power amplifier module 100a occurs in response to on/off switching of the switch 122.

Accordingly, in the power amplifier module 100a, the control unit 121a controls the gain of the drive-stage amplifier 111a at a timing when the switch 122 is turned on to suppress the non-linear characteristics.

Figure 6:
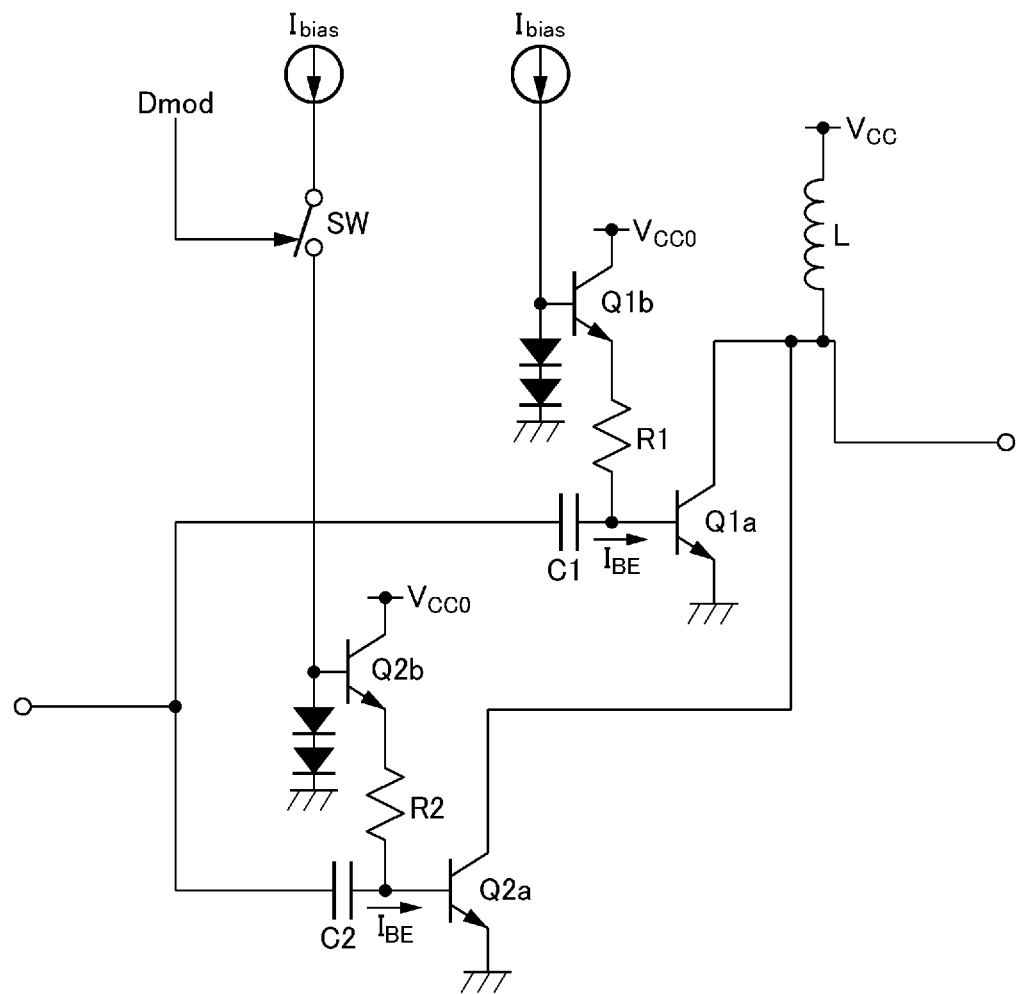
FIG. 6 illustrates an example of a configuration of a drive-stage amplifier of the power amplifier module according to the first modification.

An operation of the power amplifier module 100a according to the first modification will be specifically described with reference to FIGS. 5 and 6. FIG. 6 illustrates an example of a configuration of the drive-stage amplifier 111a of the power amplifier module 100a according to the first modification.

As illustrated in FIG. 5, in response to input of the signal Dmod, the control unit 121a turns on the switch 122. In response to turn-on of the switch 122, the peaking amplifier 114 starts operating in parallel with the carrier amplifier 113. Consequently, in the power amplifier module 100a, the load impedance seen from the output end of the carrier amplifier 113 decreases, and thus the gain decreases. Consequently, the non-linear characteristics of the power amplifier module 100a increase.

Accordingly, to suppress the non-linear characteristics, the control unit 121a compensates for the gain of the drive-stage amplifier 111a in response to input of the signal Dmod. The principal of compensating for the gain of the drive-stage amplifier 111a will be described below.

FIG. 6 illustrates an example of the configuration of the drive-stage amplifier 111a of the power amplifier module 100a according to the first modification.

As illustrated in FIG. 6, the drive-stage amplifier 111a includes, for example, a transistor Q1a and a transistor Q1b connected in parallel with each other, and amplifies a signal in two stages. An emitter of a transistor Q2b is connected to a base of a transistor Q2a with a resistor R2 interposed therebetween. A switch SW is connected in series with a base of the transistor Q2b. In response to input of the signal Dmod, the switch SW is turned on. Consequently, a bias control current $I_{bias}$ for controlling a bias current supplied to the base of the transistor Q2a from the transistor Q2b is supplied to the base of the transistor Q2b. That is, in the power amplifier module 100a, substantially simultaneously with the switch 122 being turned on by the signal Dmod, the transistor Q2a is caused to operate to increase the total bias current at the drive stage. In this manner, the gain of the drive-stage amplifier 111a is increased.

In other words, to compensate for a decrease in gain in response to a decrease in load impedance seen from the output end of the carrier amplifier 113 caused by turn-on of the switch 122, the power amplifier module 100a causes the transistor Q2a to operate based on the signal Dmod and increases the gain of the drive-stage amplifier 111a.

Figure 7:
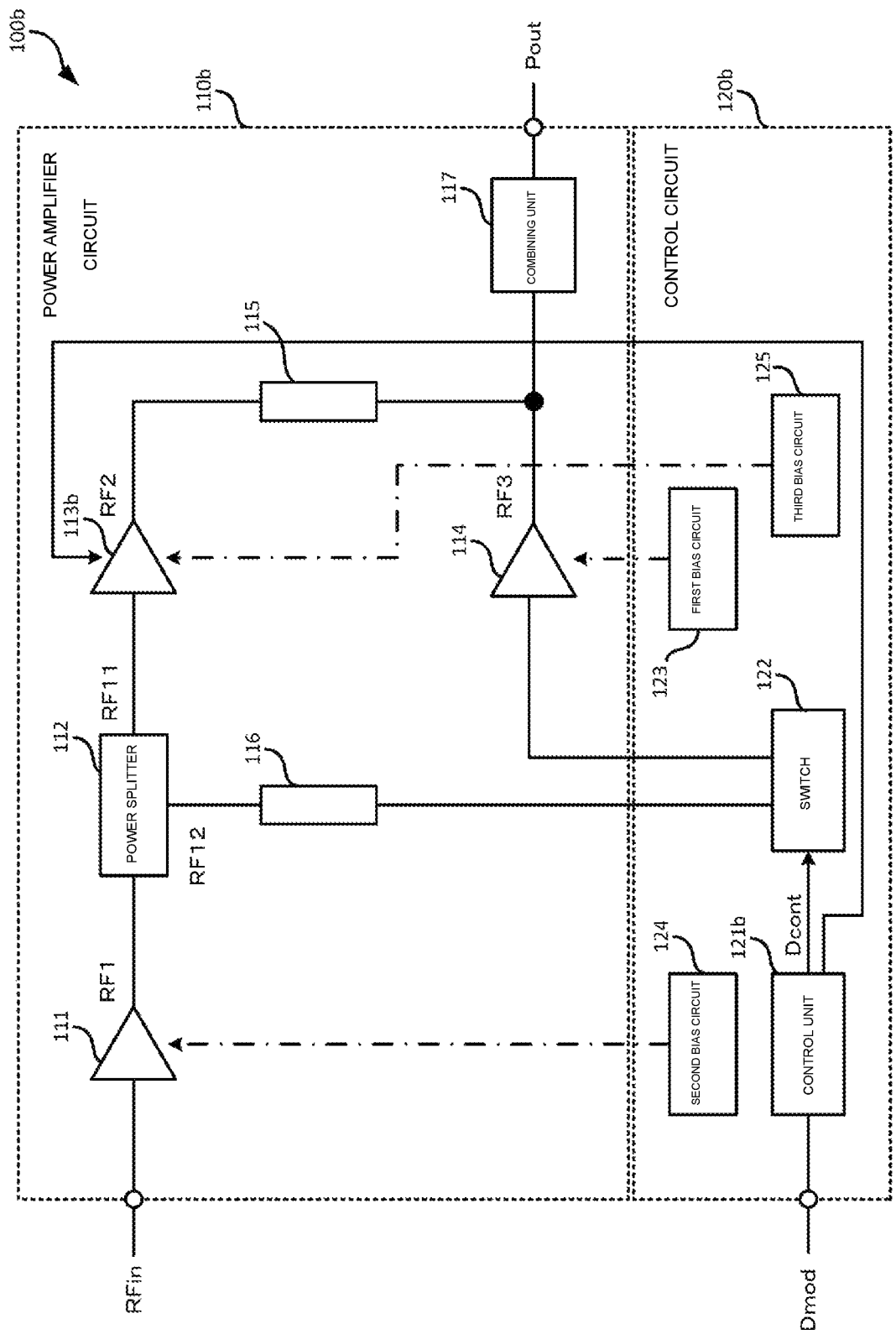
FIG. 7 illustrates an example of a configuration of a power amplifier module according to another example of the first modification.

FIG. 7 illustrates an example of a configuration of a power amplifier module 100b according to another example of the first modification. As illustrated in FIG. 7, in the power amplifier module 100b, a control unit 121b may control the gain of a carrier amplifier 113b at a timing when the switch 122 is turned on.

Thus, in the power amplifier module 100a, suppression due to a decrease in load impedance of the carrier amplifier 113b is cancelled by increasing a current flowing through a transistor constituting the carrier amplifier 113b and increasing mutual conductance, and a decrease in gain can be suppressed. Thus, non-linear characteristics can be suppressed.

Second Modification

Figure 8:
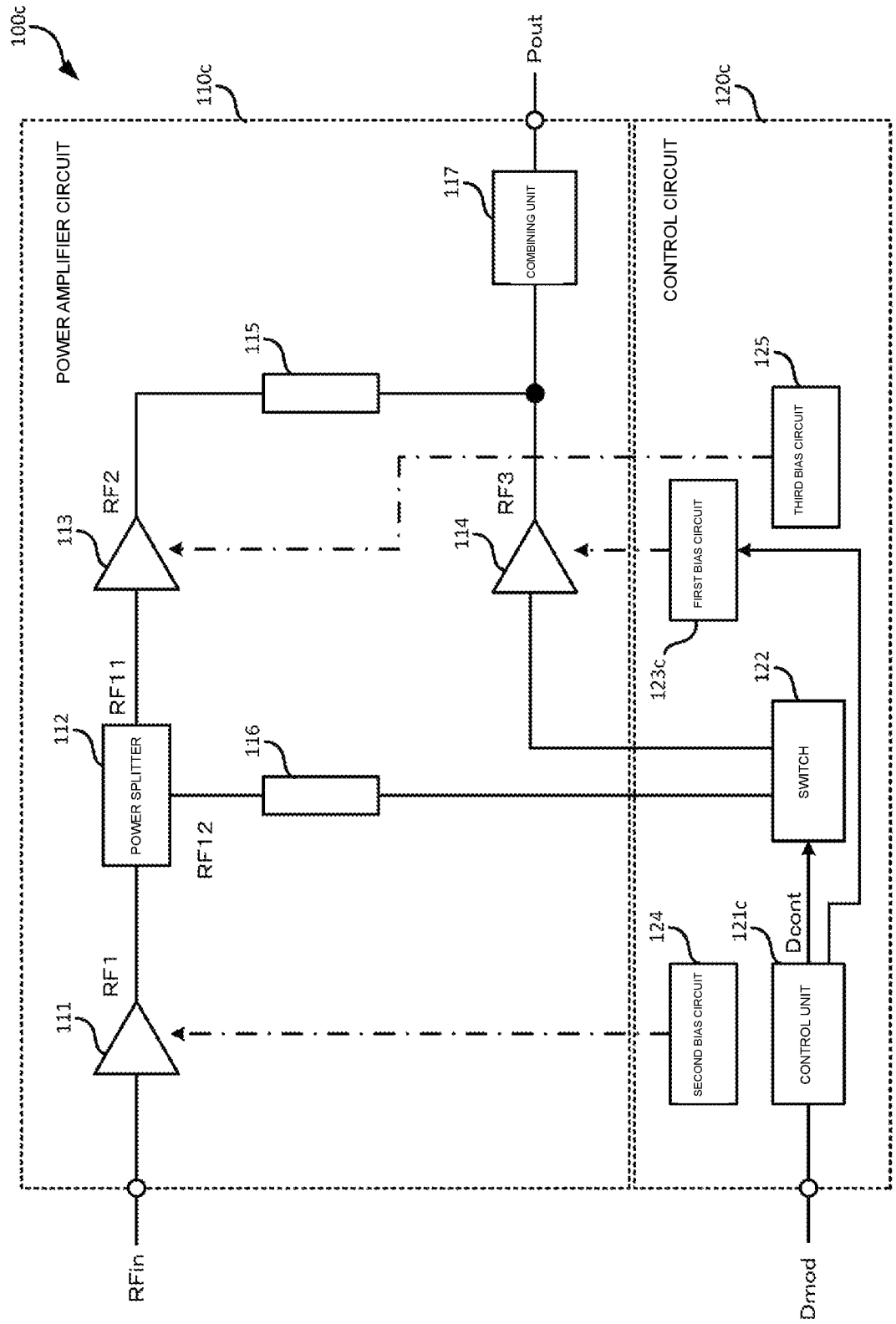
FIG. 8 illustrates an example of a configuration of a power amplifier module according to a second modification.

A configuration of a power amplifier module 100c according to a second modification will be described with reference to FIG. 8. FIG. 8 illustrates an example of the configuration of the power amplifier module 100c according to the second modification. Compared with the power amplifier module 100, in the power amplifier module 100c, a first bias circuit 123c for the peaking amplifier 114 is controlled by a control unit 121c of a control circuit 120c as illustrated in FIG. 8.

When the peaking amplifier 114 is biased in class A, class AB, or class B by the first bias circuit 123c, the current continues to flow through the peaking amplifier 114 even if the switch 122 is in the off state. Thus, when the peaking amplifier 114 is biased in class A, class AB, or class B, the bias current from the first bias circuit 123c is desirably blocked from the viewpoint of reducing power consumption.

Accordingly, in the power amplifier module 100c according to the second modification, the control unit 121c turns on and off the first bias circuit 123c in response to turn-on and turn-off of the switch 122. In this manner, the power amplifier module 100c reduces power consumption.

An operation of the power amplifier module 100c according to the second modification will be specifically described with reference to FIG. 8.

As illustrated in FIG. 8, in response to input of the signal Dmod, the control unit 121c turns on the switch 122 and turns on the first bias circuit 123c. That is, the control unit 121c turns on the switch 122 to cause the signal RF12 to be input to the peaking amplifier 114 and turns on the first bias circuit 123c to bias the peaking amplifier 114 in class A, class AB, or class B.

In response to input of the signal Dmod stopping, the control unit 121c turns off the switch 122 and turns off the first bias circuit 123c. That is, the control unit 121c turns off the switch 122 so that the signal RF12 is blocked and is not input to the peaking amplifier 114 and turns off the first bias circuit 123c so that the peaking amplifier 114 is not biased.

Consequently, the power amplifier module 100c can reduce power consumption when the peaking amplifier 114 is not in operation.

Third Modification

Figure 9:
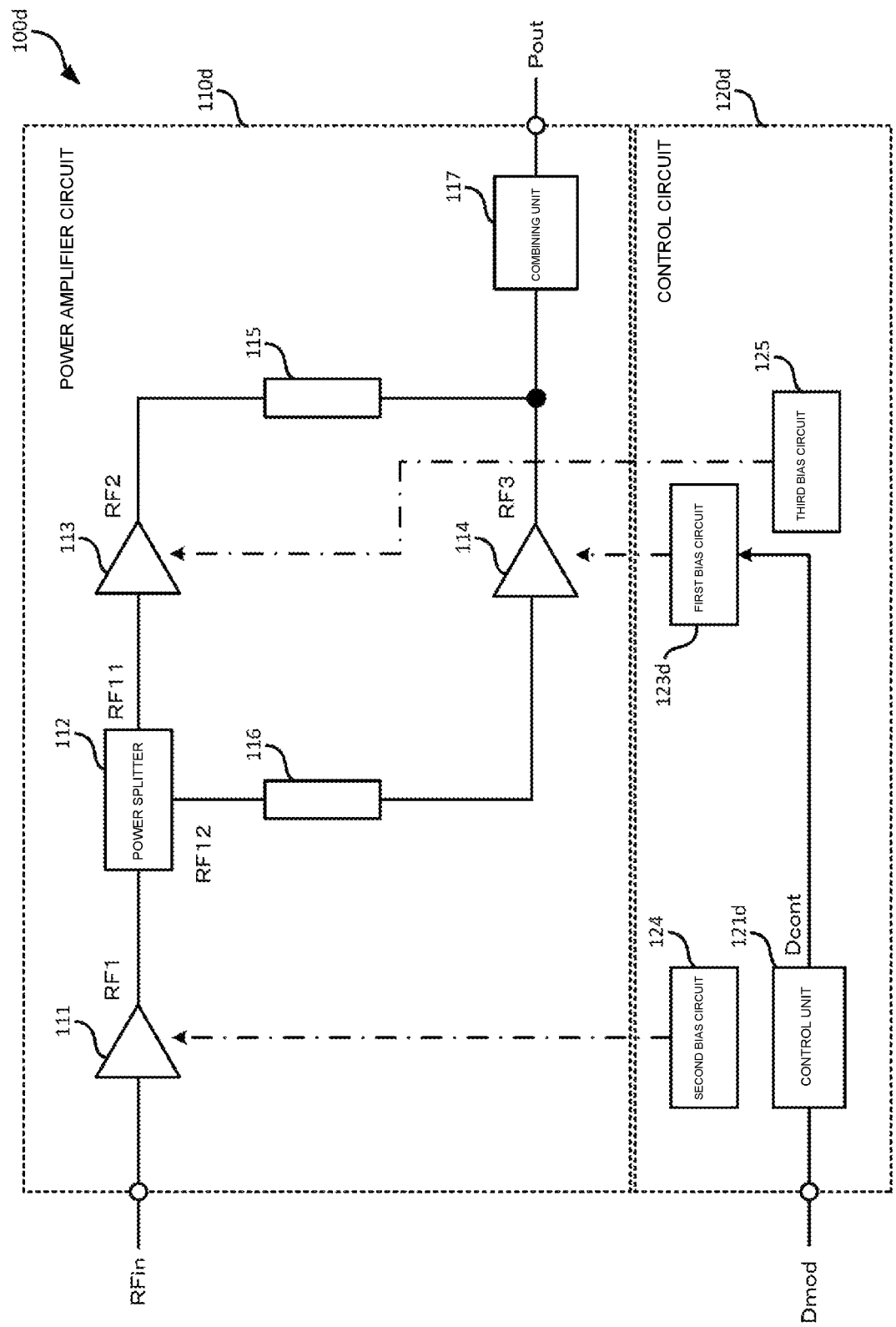
FIG. 9 illustrates an example of a configuration of a power amplifier module according to a third modification.

A configuration of a power amplifier module 100d according to a third modification will be described with reference to FIG. 9. Compared with the power amplifier module 100, the power amplifier module 100d does not include the switch 122, and a first bias circuit 123d for the peaking amplifier 114 is controlled by a control unit 121d of a control circuit 120d as illustrated in FIG. 9.

Every time the peaking amplifier 114 is turned on and off by the switch 122, load impedance seen from the output end of the drive-stage amplifier 111 varies in the power amplifier module 100d. That is, a change in gain of the power amplifier module 100d increase due to turn-on and turn-off of the switch 122.

Accordingly, the power amplifier module 100d according to the third modification does not include the switch 122, and the control unit 121d turns on and off the first bias circuit 123d to switch the operation of the peaking amplifier 114. When the first bias circuit 123d is in the off state, a deep class-C bias is applied to the peaking amplifier 114. When the first bias circuit 123d is in the on state, a shallow class-C bias, a class-A bias, a class-AB bias, or a class-B bias is applied to the peaking amplifier 114.

An operation of the power amplifier module 100d according to the third modification will be specifically described with reference to FIG. 9.

As illustrated in FIG. 9, in response to input of the signal Dmod, the control unit 121d turns on the first bias circuit 123d. That is, in the power amplifier module 100d, the first bias circuit 123d is turned on, so that the peaking amplifier 114 is biased. In response to input of the signal Dmod stopping, the control unit 121d turns off the first bias circuit 123d. That is, in the power amplifier module 100d, the first bias circuit 123d is turned off, so that the peaking amplifier 114 is not biased. Consequently, the power amplifier module 100d can reduce power consumption when the peaking amplifier 114 is not in operation, and can suppress non-linear characteristics caused by turn-on and turn-off of the switch 122.

Fourth Modification

Figure 10:
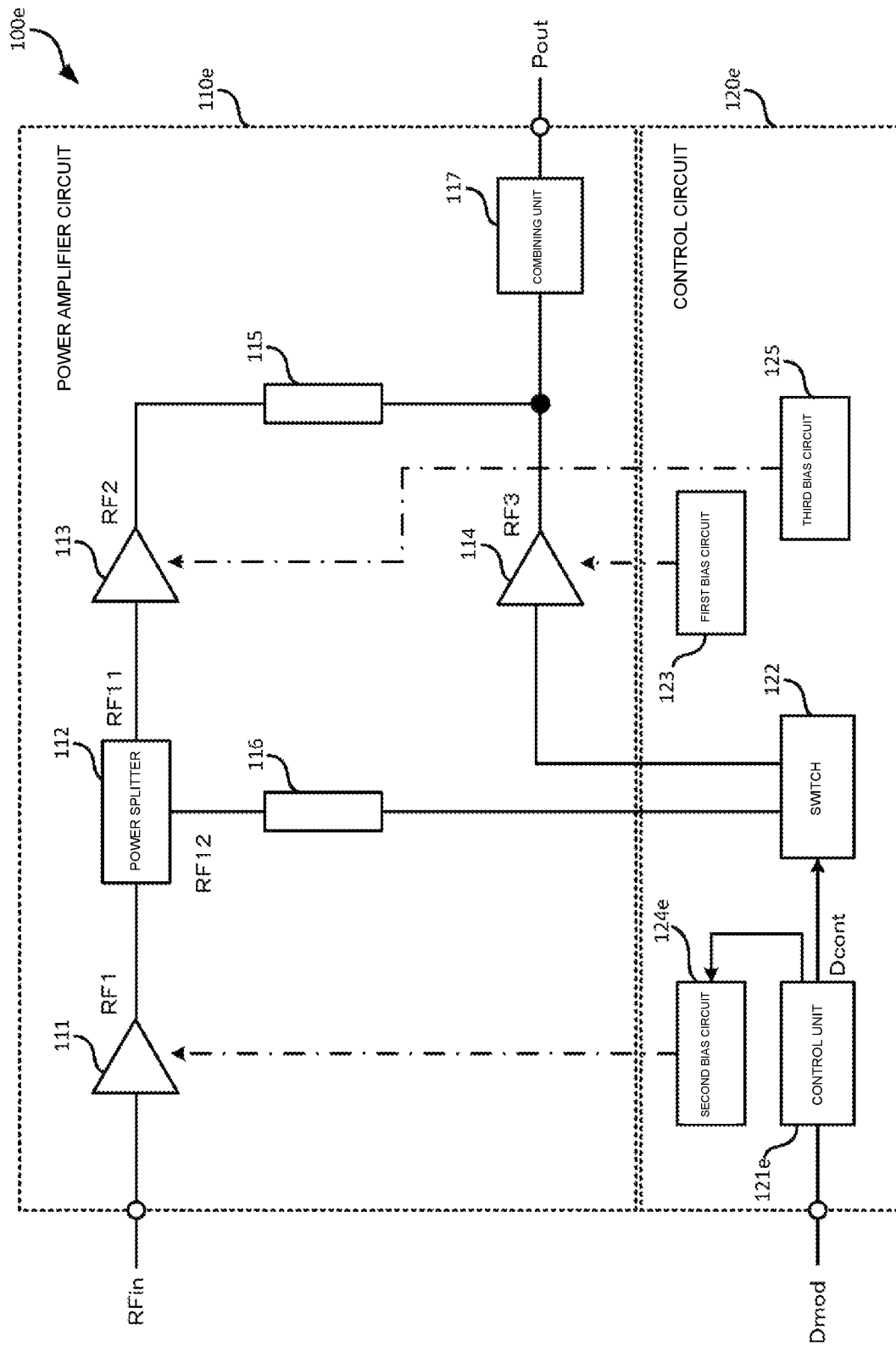
FIG. 10 illustrates an example of a configuration of a power amplifier module according to a fourth modification.

A configuration of a power amplifier module 100e according to a fourth modification will be described with reference to FIG. 10. Compared with the power amplifier module 100, in the power amplifier module 100e, a second bias circuit 124e for the drive-stage amplifier 111 is controlled by a control unit 121e of a control circuit 120e as illustrated in FIG. 10.

In the power amplifier module 100e, in response to input of the signal Dmod to the control unit 121e, the control unit 121e turns on the switch 122. This causes the peaking amplifier 114 to operate in parallel with the carrier amplifier 113 in the power amplifier module 100e.

At this time, the gain of the power amplifier module 100e differs between the state in which the carrier amplifier 113 alone is in operation in a power amplifier circuit 110e and the state in which the carrier amplifier 113 and the peaking amplifier 114 are in operation in the power amplifier circuit 110e. That is, the non-linear characteristics of the power amplifier module 100e increase in response to on/off switching of the switch 122.

Accordingly, in the power amplifier module 100e, the control unit 121e adjusts the magnitude of the bias current or voltage supplied by the second bias circuit 124e to control the gain of the drive-stage amplifier 111 at a timing when the switch 122 is turned on. In this manner, the power amplifier module 100e suppresses the non-linear characteristics.

An operation of the power amplifier module 100e according to the fourth modification will be specifically described with reference to FIG. 10.

As illustrated in FIG. 10, in response to input of the signal Dmod, the control unit 121e turns on the switch 122. In response to turn-on of the switch 122, the peaking amplifier 114 starts operating in parallel with the carrier amplifier 113. Consequently, in the power amplifier module 100e, the load impedance of the carrier amplifier 113 decreases, and thus the gain decreases. Thus, the non-linear characteristics of the power amplifier module 100e increase.

Accordingly, to suppress the non-linear characteristics, in response to input of the signal Dmod, the control unit 121e adjusts the magnitude of the bias current or voltage supplied by the second bias circuit 124e so that the gain of the drive-stage amplifier 111 is compensated for.

In this manner, the control unit 121e compensates for the gain of the drive-stage amplifier 111 and can suppress the non-linear characteristics.

Power Amplifier Module 300 According to Second Embodiment

Figure 12:
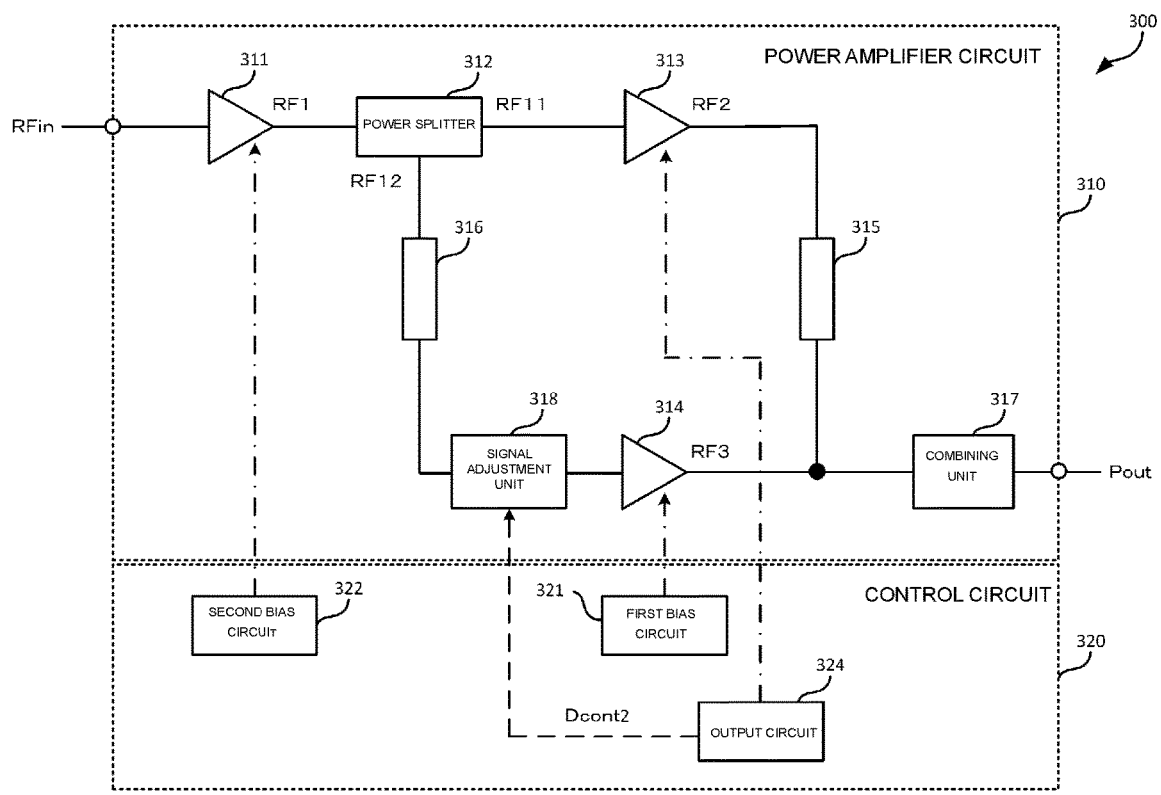
FIG. 12 illustrates an example of a configuration of a power amplifier module according to a second embodiment.
Figure 13:
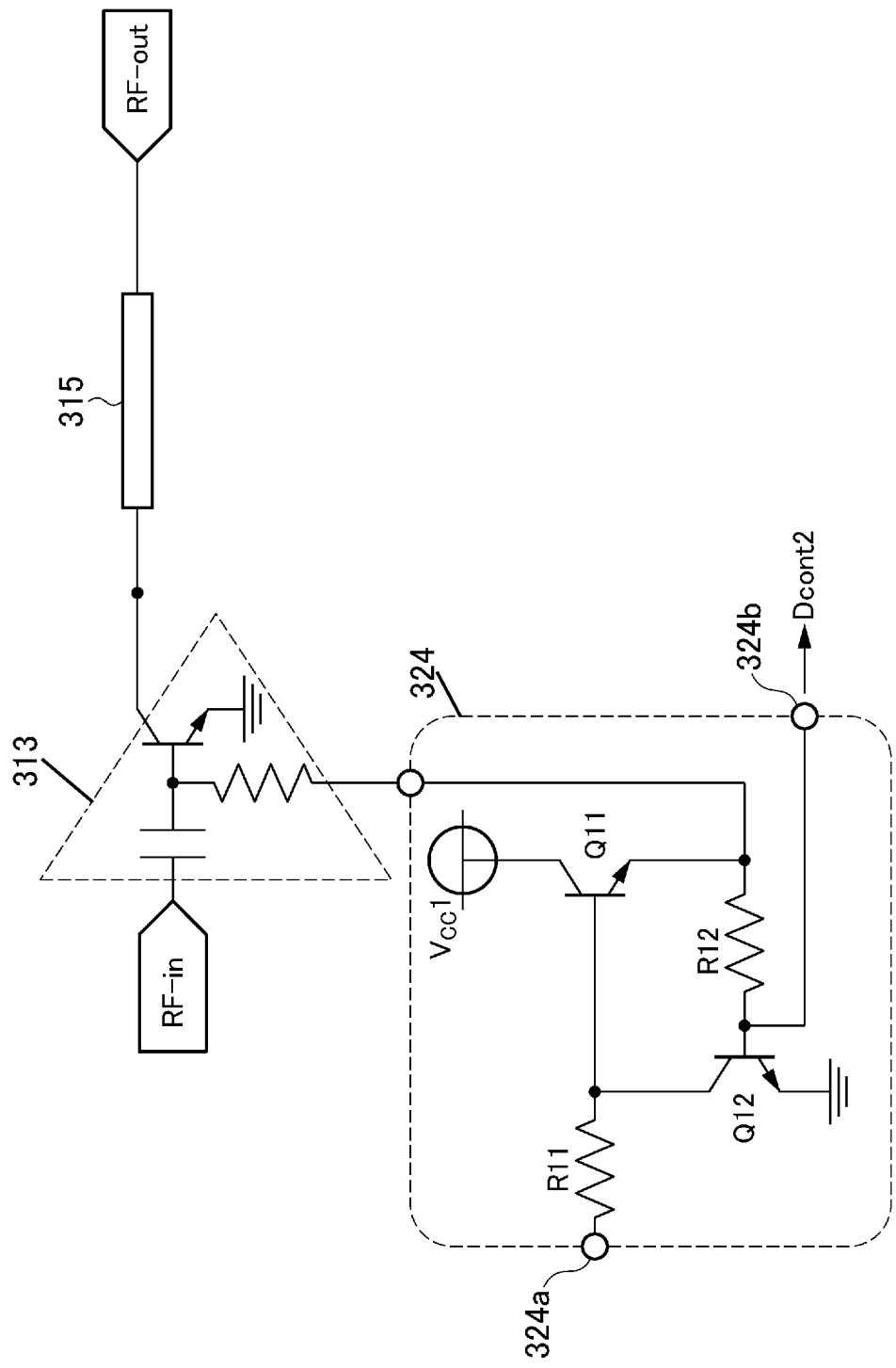
FIG. 13 illustrates an example of a configuration of an output circuit according to the second embodiment.
Figure 14:
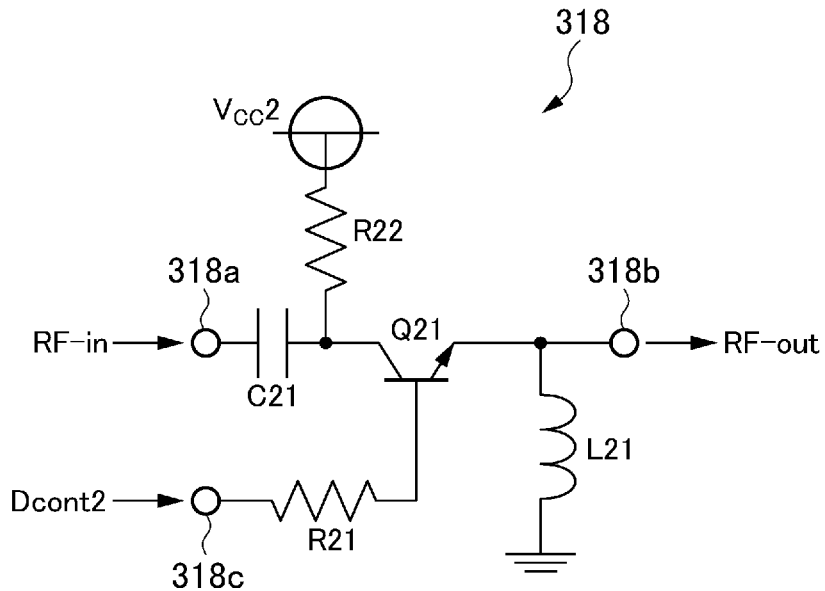
FIG. 14 illustrates an example of a configuration of a signal adjustment unit according to the second embodiment.

A power amplifier module 300 according to a second embodiment will be described with reference to FIGS. 12 to 14. FIG. 12 illustrates an example of a configuration of the power amplifier module 300 according to the second embodiment. FIG. 13 illustrates an example of a configuration of an output circuit 324. FIG. 14 illustrates an example of a configuration of a signal adjustment unit 318. In the second embodiment, description of configurations common to those of the embodiment described above is omitted, and differences alone will be described. In particular, similar advantages provided by similar configurations are not described individually.

For example, based on a base current of a carrier amplifier 313, the power amplifier module 300 according to the second embodiment detects saturation of the carrier amplifier 313. In response to detection of saturation of the carrier amplifier 313, the power amplifier module 300 causes a peaking amplifier 314 to operate. In this manner, the power amplifier module 300 can prevent a power amplifier circuit 310 from being damaged because of an operation delay of the peaking amplifier 314. As illustrated in FIG. 12, the power amplifier module 300 includes the output circuit 324 and the signal adjustment unit 318. Compared with the power amplifier module 100, for example, in the power amplifier module 300, the peaking amplifier 314 is controlled by the output circuit 324 and the signal adjustment unit 318 instead of the peaking amplifier 114 being controlled by the control unit 121 and the switch 122. Specifically, in the power amplifier module 300, for example, based on a base current of the carrier amplifier 313, the output circuit 324 outputs a control signal (hereinafter, referred to as a "signal Dcont2") indicating saturation of the carrier amplifier 313 to the signal adjustment unit 318. Based on the signal Dcont2, the signal adjustment unit 318 allows the signal RF12 to pass therethrough and causes the peaking amplifier 314 to operate. As described above, the power amplifier module 300 can cause the peaking amplifier 314 to operate at an appropriate timing in response to saturation of the carrier amplifier 313. Thus, the power amplifier module 300 can prevent the power amplifier circuit 310 from being damaged.

The output circuit 324 will be described with reference to FIG. 13. For example, the output circuit 324 supplies a bias current to the carrier amplifier 313 and detects a base current of the carrier amplifier 313. The output circuit 324 may be or may not be included in a control circuit 320. Based on the base current of the carrier amplifier 313, the output circuit 324 outputs the signal Dcont2 for controlling the signal adjustment unit 318. As illustrated in FIG. 13, the output circuit 324 includes, for example, an input terminal 324a, an output terminal 324b, a transistor Q11, a transistor Q12, a resistor R11, and a resistor R12. The input terminal 324a is a terminal supplied with a control signal for controlling the bias current. The output terminal 324b is a terminal for outputting the signal Dcont2. The transistor Q11 is a transistor that supplies the bias current to the carrier amplifier 313. For example, the transistor Q11 has a collector connected to a power supply Vcc1, and an emitter connected to the base of the carrier amplifier 313 with a resistor interposed therebetween. For example, the transistor Q11 has a base supplied with the control signal for controlling the bias current through the resistor R11. The transistor Q12 has a collector connected to the base of the transistor Q11, a base connected to the emitter of the transistor Q11 with the resistor R12 interposed therebetween, and an emitter connected to ground. The output terminal 324b is connected to a node between the base of the transistor Q12 and the resistor R12.

The signal adjustment unit 318 will be described next with reference to FIG. 14. The signal adjustment unit 318 is connected in series with the base of the peaking amplifier 314. For example, based on the signal Dcont2, the signal adjustment unit 318 performs control as to whether to pass the signal RF12 therethrough. The signal adjustment unit 318 is, for example, a variable attenuator that changes bandpass characteristics for the signal RF12 based on the signal Dcont2. In this manner, the signal adjustment unit 318 can easily control the operation point of the peaking amplifier 314. As illustrated in FIG. 14, the signal adjustment unit 318 includes, for example, an input terminal 318a, an output terminal 318b, a control terminal 318c, a transistor Q21, a resistor R21, a resistor R22, a capacitor C21, and an inductor L21. The input terminal 318a is a terminal supplied with the signal RF12. The output terminal 318b is a terminal for outputting the signal RF12 from an emitter of the transistor Q21 in accordance with the signal Dcont2. The control terminal 318c is a terminal supplied with the signal Dcont2. The transistor Q21 has a collector connected to the input terminal 318a with the capacitor C21 interposed therebetween, the emitter connected to the output terminal 318b, and a base connected to the control terminal 318c with the resistor R21 interposed therebetween. The collector of the transistor Q21 is also connected to a power supply Vcc2 with the resistor R22 interposed therebetween. The capacitor C21 is a capacitor for cutting a DC component of the signal RF12. The inductor L21 has one end connected to the emitter of the transistor Q21 and the other end connected to ground. The inductor L21 is an inductor for causing the DC component of the signal RF12 to flow to ground. In this example, the output terminal 324b of the output circuit 324 illustrated in FIG. 13 is directly connected to the control terminal 318c illustrated in FIG. 14; however, a level-shifting circuit may be appropriately inserted therebetween. The transistor Q21 is illustrated as a bipolar transistor in FIG. 14 but may be a FET.

The signal adjustment unit 318 is not limited to a variable attenuator described above. The signal adjustment unit 318 may be, for example, a switch that performs switching as to whether to input the signal RF12 to the peaking amplifier 314. The switch is connected in series with the base of the peaking amplifier 314, for example. In response to input of the signal Dcont2 from the output circuit 324, the switch is turned on. That is, the switch is switched so that the signal RF12 is input to the peaking amplifier 314 when the switch is in the on state and the signal RF12 is not input to the peaking amplifier 314 when the switch is in the off state, for example. In this manner, the signal adjustment unit 318 can control the operation point of the peaking amplifier 314 with a simple configuration.

FIG. 12 illustrates the power amplifier circuit 310 including a single carrier amplifier and a single peaking amplifier; however, the configuration is not limited to this. For example, the power amplifier circuit 310 may include a plurality of series-connected carrier amplifiers, and a plurality of series-connected peaking amplifiers. In this case, the output circuit 324 is desirably provided to detect the base current of the carrier amplifier closest to the output end, for example. It is sufficient that the signal adjustment unit 318 is connected in series with the base of any of the plurality of peaking amplifiers, for example.

Figure 15:
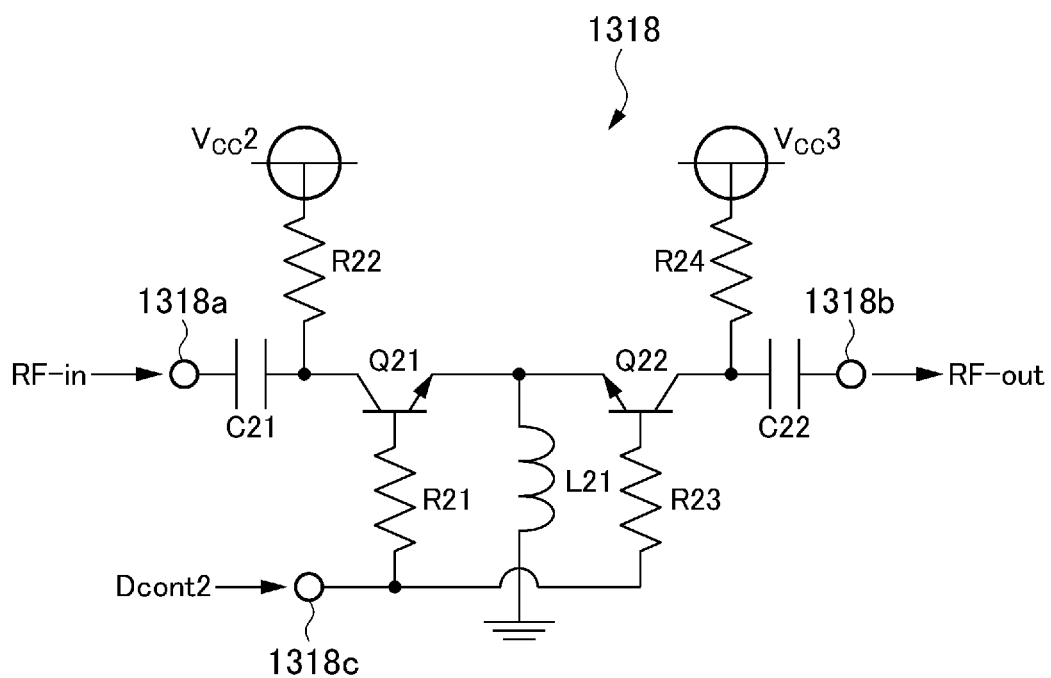
FIG. 15 illustrates an example of a configuration of a signal adjustment unit according to a first modification.

A first modification of the signal adjustment unit 318 will be described with reference to FIG. 15. FIG. 15 illustrates an example of a configuration of a signal adjustment unit 1318 according to the first modification. Description of configurations common to those of the signal adjustment unit 318 according to the embodiment described above is omitted, and differences alone will be described. As illustrated in FIG. 15, the signal adjustment unit 1318 is, for example, a circuit additionally including a transistor Q22, a resistor R23, a resistor R24, and a capacitor C22 between an input terminal 1318a and an output terminal 1318b, compared with the signal adjustment unit 318. The transistor Q22 has a collector connected to the output terminal 1318b with the capacitor C22 interposed therebetween, an emitter connected to ground with the inductor L21 interposed therebetween, and a base connected to a control terminal 1318c with the resistor R23 interposed therebetween. The emitter of the transistor Q22 is also connected to the emitter of the transistor Q21. The collector of the transistor Q22 is connected to a power supply Vcc3 with the resistor R24 interposed therebetween. In this example, the output terminal 324b of the output circuit 324 illustrated in FIG. 13 is directly connected to the control terminal 1318c illustrated in FIG. 15; however, a level-shifting circuit may be appropriately inserted therebetween. The transistors Q21 and Q22 are illustrated as bipolar transistors in FIG. 15 but may be FETs.

Figure 16:
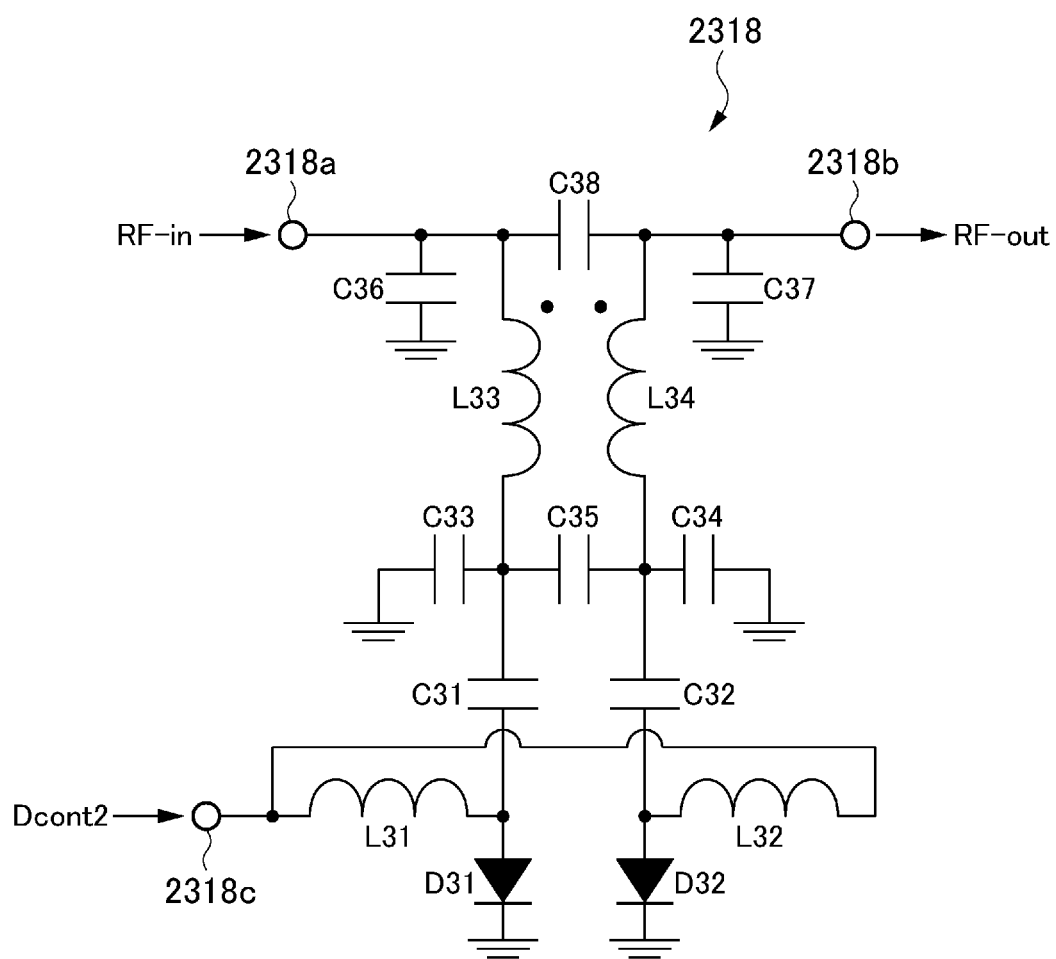
FIG. 16 illustrates an example of a configuration of a signal adjustment unit according to a second modification.

A second modification of the signal adjustment unit 318 will be described with reference to FIG. 16. FIG. 16 illustrates an example of a configuration of a signal adjustment unit 2318 according to the second modification. As illustrated in FIG. 16, the signal adjustment unit 2318 includes, for example, an input terminal 2318a, an output terminal 2318b, a control terminal 2318c, a diode D31, a diode D32, an inductor L31, an inductor L32, a capacitor C31, a capacitor C32, and inductors L33 and L34 and capacitors C33, C34, C35, C36, and C37 that constitute a 90-degree hybrid circuit. The input terminal 2318a is a terminal supplied with the signal RF12. The output terminal 2318b is a terminal from which the signal RF12 is output in accordance with the signal Dcont2. The control terminal 2318c is connected to an anode of the diode D31 with the inductor L31 interposed therebetween and to an anode of the diode D32 with the inductor L32 interposed therebetween. Cathodes of the diodes D31 and D32 are connected to ground. The capacitor C31 is a capacitor for cutting a DC component. The capacitor C31 has one end connected to the anode of the diode D31 and the other end connected to the 90-degree hybrid circuit. The capacitor C32 is a capacitor for cutting a DC component. The capacitor C32 has one end connected to the anode of the diode D32 and the other end connected to the 90-degree hybrid circuit. In this example, the output terminal 324b of the output circuit 324 illustrated in FIG. 13 is directly connected to the control terminal 2318c illustrated in FIG. 16; however, a level-shifting circuit may be appropriately inserted therebetween. A FET having a drain and a gate connected to each other may be used in place of the diodes D31 and D32 illustrated in FIG. 16.

Operation of Power Amplifier Module 300 According to Second Embodiment

An operation of the power amplifier module 300 will be described below with reference to FIGS. 12 to 14. First, in response to saturation of the carrier amplifier 313 in the power amplifier module 300, the state of the base-collector diode changes to the on state. Consequently, the base current of the carrier amplifier 313 increases, and the current flowing from the emitter of the transistor Q11 of the output circuit 324 illustrated in FIG. 13 to the carrier amplifier 313 increases. At this time, as the current supplied from the emitter of the transistor Q11 increases, the potential at the emitter of the transistor Q11 lowers. The current supplied from the emitter of the transistor Q11 is supplied to the base of the transistor Q12 through the resistor R12. Since the signal RF11 is not input to the transistor Q12, the current supplied from the transistor Q11 is not entirely supplied to the base of the transistor Q12. Thus, part of the current supplied from the emitter of the transistor Q11 is supplied to the output terminal 324b. The output circuit 324 outputs, as the signal Dcont2, the current supplied to the output terminal 324b. Thus, the output circuit 324 can output the signal Dcont2 based on the base current of the carrier amplifier 313.

Subsequently, the control signal Dcont2 is supplied to the base of the transistor Q21 through the resistor R21 in the signal adjustment unit 318 illustrated in FIG. 14. If the control signal Dcont2 exceeds a predetermined current value, the transistor Q21 allows the signal RF12 to pass therethrough to the output terminal 318b. The peaking amplifier 314 then amplifies the signal RF12 and outputs the signal RF3. Thus, the peaking amplifier 314 can be caused to operate without necessarily an operation delay in response to saturation of the carrier amplifier 313. Consequently, the power amplifier circuit 310 can be prevented from being damaged.

Power Amplifier Module 400 According to Third Embodiment

Figure 17:
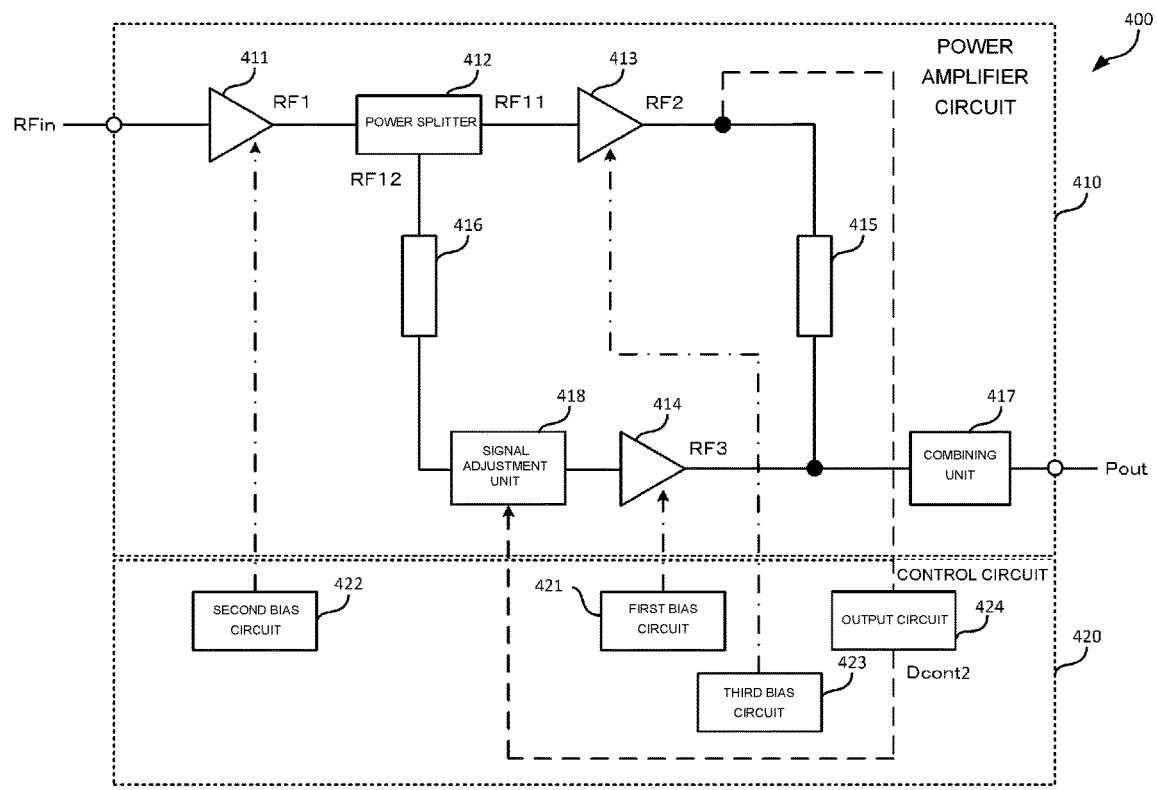
FIG. 17 illustrates an example of a configuration of a power amplifier module according to a third embodiment.
Figure 18:
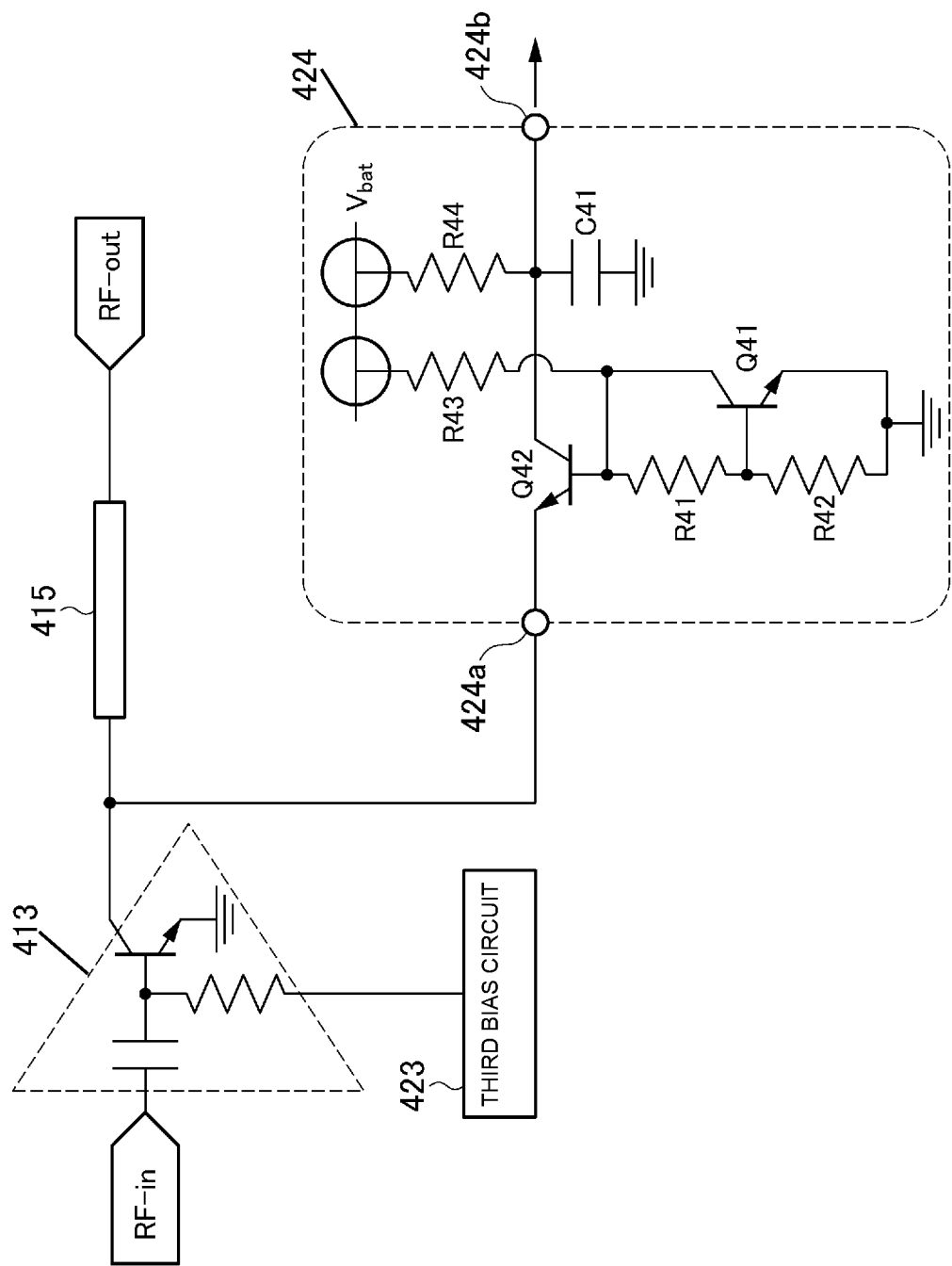
FIG. 18 illustrates an example of a configuration of an output circuit according to the third embodiment.

A power amplifier module 400 according to a third embodiment will be described with reference to FIGS. 17 and 18. FIG. 17 illustrates an example of a configuration of the power amplifier module 400 according to the third embodiment. FIG. 18 illustrates an example of a configuration of an output circuit 424. Since a signal adjustment unit 418 is substantially the same as the signal adjustment unit 318 according to the second embodiment, description of the signal adjustment unit 418 is omitted. In the third embodiment, description of configurations common to those of the embodiments described above is omitted, and differences alone will be described. In particular, similar advantages provided by similar configurations are not described individually.

For example, based on an amplitude of a collector voltage that changes according to a base current of a carrier amplifier 413, the power amplifier module 400 according to the third embodiment detects saturation of the carrier amplifier 413. In response to detection of saturation of the carrier amplifier 413, the power amplifier module 400 causes a peaking amplifier 414 to operate. Consequently, the power amplifier module 400 can prevent a power amplifier circuit 410 from being damaged because of an operation delay of the peaking amplifier 414. As illustrated in FIG. 17, the power amplifier module 400 includes the output circuit 424 and the signal adjustment unit 418. That is, compared with the power amplifier module 100, for example, in the power amplifier module 400, the peaking amplifier 414 is controlled by the output circuit 424 and the signal adjustment unit 418 instead of the peaking amplifier 114 being controlled by the control unit 121 and the switch 122. Specifically, for example, based on the amplitude of the collector voltage of the carrier amplifier 413, the power amplifier module 400 outputs, to the signal adjustment unit 418, the signal Dcont2 indicating saturation of the carrier amplifier 413 from the output circuit 424. Based on the signal Dcont2, the signal adjustment unit 418 causes the peaking amplifier 414 to operate. In this manner, the power amplifier module 400 can cause the peaking amplifier 414 to operate at an appropriate timing in response to saturation of the carrier amplifier 413. Thus, the power amplifier module 400 can prevent the power amplifier circuit 410 from being damaged.

An example of a configuration of the output circuit 424 will be described with reference to FIG. 18. The output circuit 424 detects the amplitude of the collector voltage of the carrier amplifier 313. Based on the amplitude of the collector voltage, the output circuit 424 outputs the signal Dcont2 for controlling the signal adjustment unit 418. As illustrated in FIG. 18, the output circuit 424 includes, for example, an input terminal 424a, an output terminal 424b, a transistor Q41, a transistor Q42, a resistor R41, a resistor R42, a resistor R43, a resistor R44, and a capacitor C41. The input terminal 424a is a terminal to which the collector voltage of the carrier amplifier 413 is input. The output terminal 424b is a terminal for outputting the signal Dcont2. The transistor Q41 has a collector connected to a power supply $V_{bat}$ with the resistor R43 interposed therebetween, a base connected to a node between the resistor R41 and the resistor R42, and an emitter connected to ground. The base of the transistor Q41 is connected to a base of the transistor Q42 with the resistor R41 interposed therebetween. The collector of the transistor Q41 is connected to the base of the transistor Q42. That is, the transistor Q41, the resistor R41, and the resistor R42 form a constant voltage circuit. Thus, the potential at the base of the transistor Q42 is made constant by the constant voltage circuit. The transistor Q42 has the base connected to the constant voltage circuit, a collector connected to the power supply $V_{bat}$ with the resistor R44 interposed therebetween, and an emitter connected to the input terminal 424a. The collector of the transistor Q42 is connected to the output terminal 424b. The capacitor C41 is a capacitor for smoothing the signal Dcont2. The capacitor C41 has one end connected to a node between the collector of the transistor Q42 and the output terminal 424b and the other end connected to ground.

Figure 19:
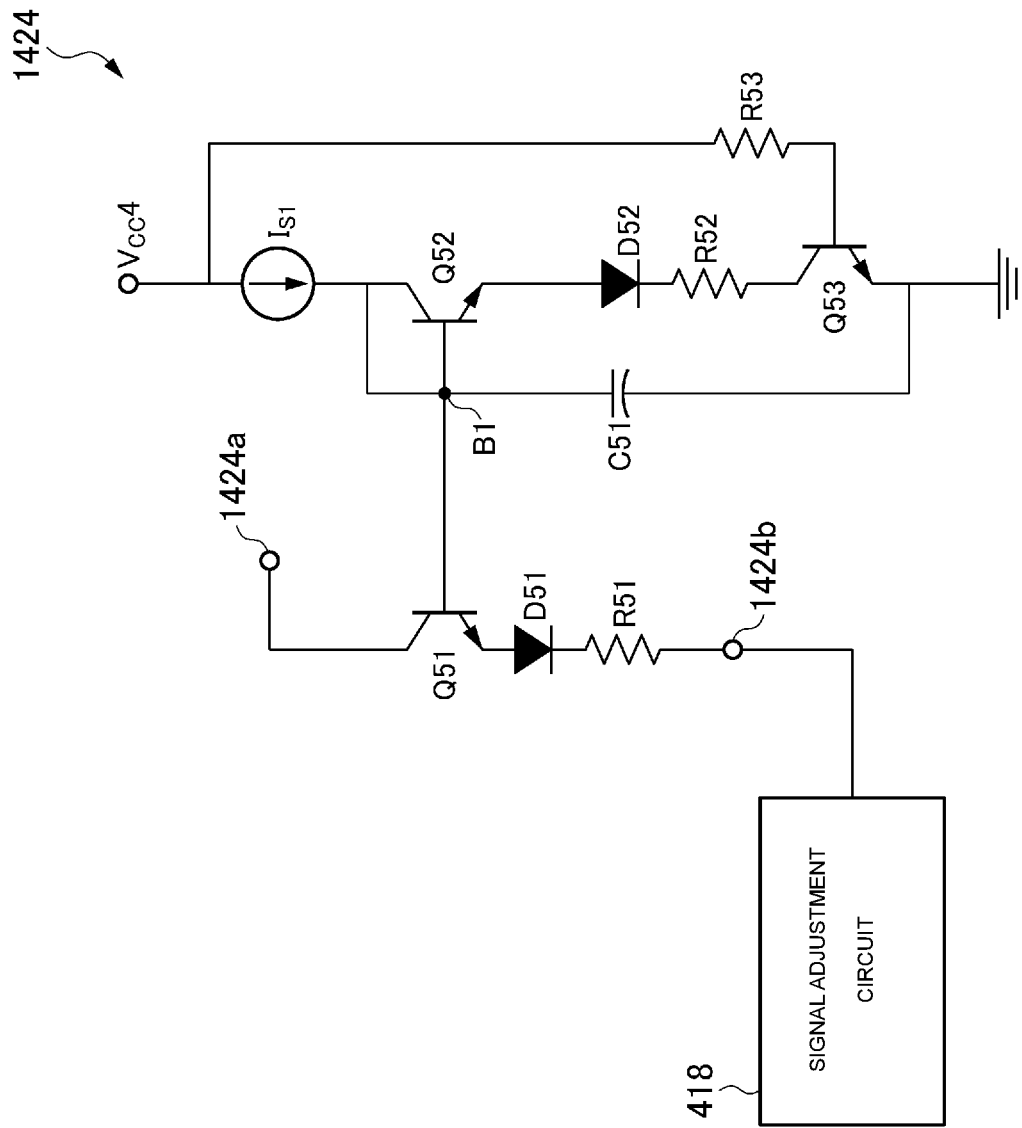
FIG. 19 illustrates an example of a configuration of an output circuit according to a first modification.

A first modification of the output circuit 424 will be described next with reference to FIG. 19. FIG. 19 illustrates an example of a configuration of an output circuit 1424 according to the first modification. As illustrated in FIG. 19, the output circuit 1424 includes, for example, an input terminal 1424a, an output terminal 1424b, a transistor Q51, a transistor Q52, a transistor Q53, a diode D51, a diode D52, a resistor R51, a resistor R52, a resistor R53, a capacitor C51, and a current source $I_{S1}$. The input terminal 1424a is a terminal to which the collector voltage of the carrier amplifier 413 is input. The output terminal 1424b is a terminal for outputting the signal Dcont2. The transistor Q51 has a collector connected to the input terminal 1424a, an emitter connected to an anode of the diode D51, and a base connected to a predetermined reference potential B1. The diode D51 has a cathode connected to the output terminal 1424b with the resistor R51 interposed therebetween. The transistor Q52 has a collector connected to a power supply Vcc4 with the current source $I_{S1}$ interposed therebetween, an emitter connected to an anode of the diode D52, and a base connected to the predetermined reference potential B1. The transistor Q53 has a collector connected to a cathode of the diode D52 with the resistor R52 interposed therebetween, an emitter connected to ground, and a base connected to the power supply Vcc4 with the resistor R53 interposed therebetween. The capacitor C51 has one end connected to the predetermined reference potential B1 and the other end connected to ground.

Figure 20:
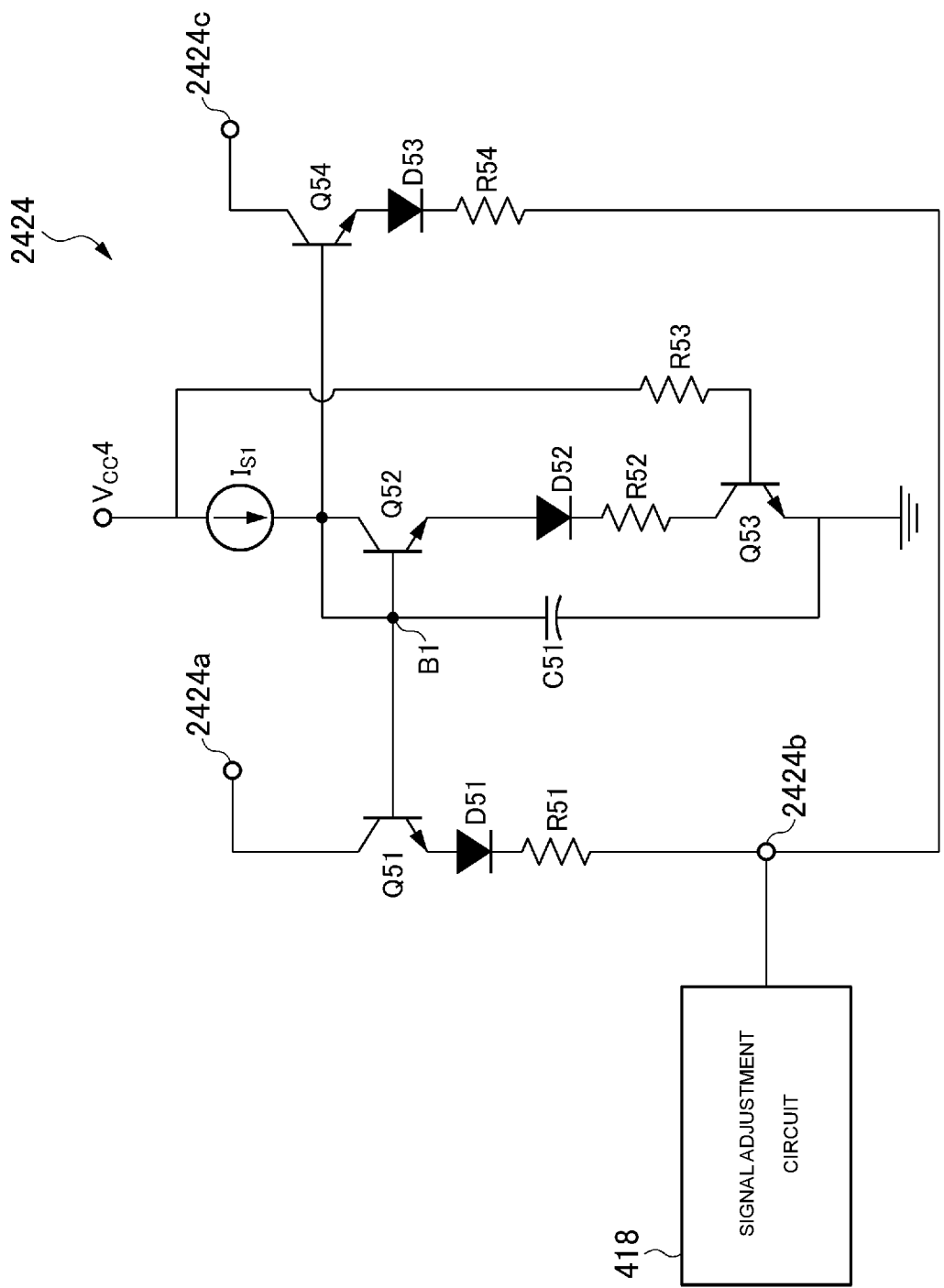
FIG. 20 illustrates an example of a configuration of an output circuit according to a second modification.

A second modification of the output circuit 424 will be described with reference to FIG. 20. FIG. 20 illustrates an example of a configuration of an output circuit 2424 according to the second modification. Description of configurations common to those of the output circuit 1424 according to the first modification described above is omitted, and differences alone will be described. As illustrated in FIG. 20, the output circuit 2424 is a circuit additionally including an input terminal 2424c, a transistor Q54, a diode D53, and a resistor R54, compared with the output circuit 1424 according to the first modification. The input terminal 2424c is, for example, a terminal to which the collector voltage of the peaking amplifier 414 is input. The transistor Q54 has a collector connected to the input terminal 2424c, an emitter connected to an anode of the diode D53, and a base connected to the predetermined reference potential B1. The diode D53 has a cathode connected to an output terminal 2424b with the resistor R54 interposed therebetween.

Operation of Power Amplifier Module 400 According to Third Embodiment

An operation of the power amplifier module 400 will be described below with reference to FIGS. 17 and 18. In response to saturation of the carrier amplifier 413 in the power amplifier module 400, the amplitude of the collector voltage of the carrier amplifier 413 increases. In accordance with the amplitude of the collector voltage of the carrier amplifier 413, the amplitude of the emitter voltage of the transistor Q42 of the output circuit 424 illustrated in FIG. 18 increases. The potential at the emitter becomes lower than the potential at the base due to the amplitude of the emitter voltage of the transistor Q42. At this time, the current flows through the emitter of the transistor Q42. Consequently, the current flows through the collector of the transistor Q42. That is, when the potential at the emitter of the transistor Q42 lowers, the current flows through the collector of the transistor Q42. The current flowing through the collector of the transistor Q42 flows from the power supply $V_{bat}$ through the resistor R44. Consequently, the voltage drops by an amount substantially equal a product of the current at the collector of the transistor Q42 and a resistance of the resistor R44. Thus, the potential at the node between the resistor R44 and the output terminal 424b lowers. That is, the potential at the output terminal 424b lowers. The output circuit 424 outputs, as the signal Dcont2, the voltage drop at the output terminal 424b.

The signal adjustment unit 418 is substantially the same as the signal adjustment unit 318 according to the second embodiment. Thus, the signal Dcont2 is desirably inverted by providing an inverting amplifier circuit (not illustrated) or a digital circuit on the output side of the output circuit 424, for example. The signal adjustment unit 418 allows the signal RF12 to pass therethrough in accordance with the signal Dcont2. Thus, the peaking amplifier 414 can be caused to operate without necessarily an operation delay in response to saturation of the carrier amplifier 413. Consequently, the power amplifier circuit 410 can be prevented from being damaged.

Power Amplifier Module 500 According to Fourth Embodiment

Figure 21:
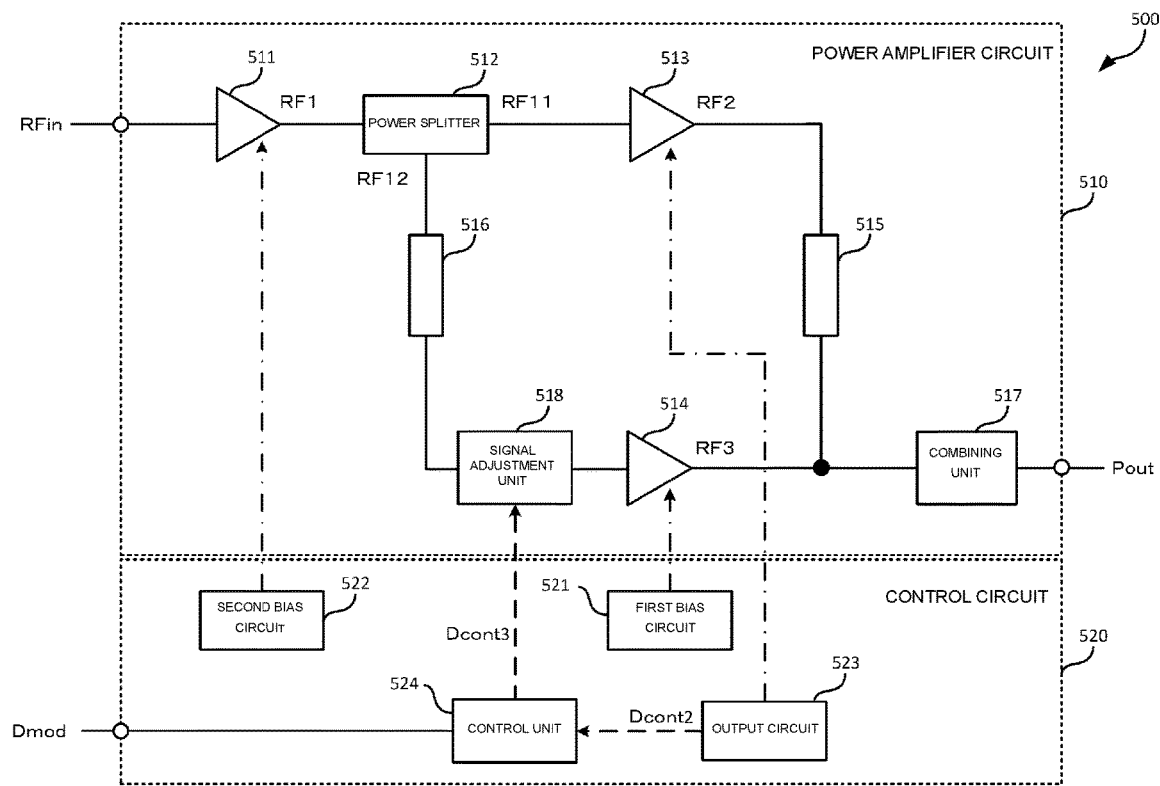
FIG. 21 illustrates an example of a configuration of a power amplifier module according to a fourth embodiment.

A power amplifier module 500 according to a fourth embodiment will be described with reference to FIG. 21. FIG. 21 illustrates an example of a configuration of the power amplifier module 500 according to the fourth embodiment. In the fourth embodiment, description of configurations common to those of the embodiments described above is omitted, and differences alone will be described. In particular, similar advantages provided by similar configurations are not described individually.

For example, based on a base current of a carrier amplifier 513, the power amplifier module 500 according to the fourth embodiment detects saturation of the carrier amplifier 513. In the power amplifier module 500, the signal Dcont2 indicating saturation of the carrier amplifier 513 is output to a control unit 524. Based on the signal Dcont2, the control unit 524 outputs a control signal (hereinafter, referred to as a "signal Dcont3") for causing a signal adjustment unit 518 to operate. The control unit 524 may output the signal Dcont3 based on the signal Dmod used in the power amplifier module 100 according to the first embodiment and the signal Dcont2. Based on the signal Dcont3, the signal adjustment unit 518 allows the signal RF12 to pass therethrough and causes a peaking amplifier 514 to operate. As described above, the power amplifier module 500 can cause the peaking amplifier 514 to operate at an appropriate timing in response to saturation of the carrier amplifier 513. Thus, the power amplifier module 500 can prevent a power amplifier circuit 510 from being damaged.

Recapitulation

The power amplifier module 100 according to an illustrative embodiment of the present disclosure includes the drive-stage amplifier 111 (first amplifier) that amplifies the signal RFin (first signal) and outputs the signal RF1 (second signal), the power splitter 112 that splits the signal RF1 (second signal) into the signal RF11 (third signal) and the signal RF12 (fourth signal), the carrier amplifier 113 (second amplifier) that amplifies the signal RF11 (third signal) and outputs the signal RF2 (fifth signal), the peaking amplifier 114 (third amplifier) that amplifies the signal RF12 (fourth signal) and outputs the signal RF3 (sixth signal), the first phase shifter 115 (phase shifter) that receives the signal RF2 (fifth signal) and shifts a phase of the signal RF2 (fifth signal), the combining unit 117 that combines the signal RF2 having the phase shifted by the first phase shifter 115 and the signal RF3 (sixth signal) and outputs the amplified signal Pout of the signal RF1 (second signal), and the control unit 121 (controller) that outputs, based on an amplitude level of the signal RFin (first signal), the signal Dcont (first control signal) for controlling a power level of the signal RF3 (sixth signal) output from the peaking amplifier 114 (third amplifier). Thus, the power amplifier module 100 that is less influenced by characteristics of transistors and reduces variations in characteristics can be provided.

The control unit 121 (controller) of the power amplifier module 100 includes the switch 122 that performs switching as to whether to output the signal RF3 (sixth signal) from the peaking amplifier 114 (third amplifier), and on and off of the switch 122 is controlled based on the signal Dcont (first control signal). Thus, the peaking amplifier 114 can be controlled stably, and the highly efficient power amplifier module 100 that is less influenced by characteristics of various elements can be implemented.

A gain of the drive-stage amplifier 111a of the power amplifier module 100a is controlled based on the signal Dcont (first control signal). Thus, non-linear characteristics caused when the peaking amplifier 114 starts operating can be suppressed.

The power amplifier module 100c further includes the first bias circuit 123c that supplies a bias current or voltage to the peaking amplifier 114 (third amplifier). The bias current or voltage supplied to the peaking amplifier 114 (third amplifier) by the first bias circuit 123c is controlled based on the signal Dcont (first control signal). Thus, the bias current does not flow through the peaking amplifier 114 when the peaking amplifier 114 is stopped. Consequently, the power amplifier module 100c can implement low power consumption.

The power amplifier module 100e further includes the second bias circuit 124e that supplies a bias current or voltage to the drive-stage amplifier 111 (first amplifier). The bias current or voltage supplied to the drive-stage amplifier 111 (first amplifier) by the second bias circuit 124e is controlled based on the signal Dcont (first control signal). Thus, non-linear characteristics caused when the peaking amplifier 114 starts operating can be suppressed.

The carrier amplifier 113 (second amplifier) of the power amplifier module 100d amplifies the signal RF11 (third signal) and outputs the signal RF2 (fifth signal) in a region where a power level of the signal RF1 (second signal) is higher than or equal to a first level, and the peaking amplifier 114 (third amplifier) amplifies the signal RF12 (fourth signal) and outputs the signal RF3 (sixth signal) in a region where the power level of the signal RF1 (second signal) is higher than or equal to a second level that is higher than the first level. Thus, power consumption can be reduced when the peaking amplifier 114 is not in operation in the power amplifier module 100d.

A gain of the carrier amplifier 113b (second amplifier) of the power amplifier module 100b is controlled based on the signal Dcont (first control signal). Thus, the power amplifier module 100b can suppress a decrease in load impedance of the carrier amplifier 113b and suppress a decrease in gain. Consequently, non-linear characteristics can be suppressed.

The power amplifier module 300, 400, or 500 includes a drive-stage amplifier 311 (first amplifier) that amplifies the signal RFin (first signal) and outputs the signal RF1 (second signal), a power splitter 312 that splits the signal RF1 (second signal) into the signal RF11 (third signal) and the signal RF12 (fourth signal), the carrier amplifier 313 (second amplifier) that amplifies the signal RF11 (third signal) and outputs the signal RF2 (fifth signal), the peaking amplifier 314 (third amplifier) that amplifies the signal RF12 (fourth signal) and outputs the signal RF3 (sixth signal), a first phase shifter 315 (phase shifter) that receives the signal RF2 (fifth signal) and shifts a phase of the signal RF2 (fifth signal), a combining unit 317 that combines the signal RF2 (fifth signal) having the phase shifted by the first phase shifter 315 (phase shifter) and the signal RF3 (sixth signal) and outputs the amplified signal Pout of the signal RF1 (second signal), the signal adjustment unit 318 that is between the power splitter 312 and the peaking amplifier 314 (third amplifier) and adjusts a passing amount of the signal RF12 (fourth signal), and the output circuit 324 that outputs, based on a base current of the carrier amplifier 313 (second amplifier), to the signal adjustment unit 318, the signal Dcont2 (second control signal) for controlling the signal adjustment unit 318, in which based on the signal Dcont2 (second control signal), the signal adjustment unit 318 adjusts the passing amount of the signal RF12 (fourth signal). Thus, power consumption can be reduced when the peaking amplifier 314, 414, or 514 is not in operation and the peaking amplifier 314, 414, or 514 can be caused to operate at an appropriate timing in response to saturation of the carrier amplifier 313, 413, or 513 in the power amplifier module 300, 400, or 500. Consequently, the power amplifier circuit 310, 410, or 510 can be prevented from being damaged.

Based on a bias current supplied to a base of the carrier amplifier 313 (second amplifier), the output circuit 324 of the power amplifier module 300 outputs the signal Dcont2 (second control signal). Thus, power consumption can be reduced when the peaking amplifier 314 is not in operation and the peaking amplifier 314 can be caused to operate at an appropriate timing in response to saturation of the carrier amplifier 313 in the power amplifier module 300. Consequently, the power amplifier circuit 310 can be prevented from being damaged.

Based on the signal RF2 (fifth signal) that changes according to the base current of the carrier amplifier 413 (second amplifier), the output circuit 424 of the power amplifier module 400 outputs the signal Dcont2 (second control signal). Thus, power consumption can be reduced when the peaking amplifier 414 is not in operation and the peaking amplifier 414 can be caused to operate at an appropriate timing in response to saturation of the carrier amplifier 413 in the power amplifier module 400. Consequently, the power amplifier circuit 410 can be prevented from being damaged.

The signal adjustment unit 318, 418, or 518 of the power amplifier module 300, 400, or 500 includes a variable attenuator that changes current passing characteristics in accordance with the signal Dcont2 (second control signal). Thus, the operation point of the peaking amplifier 314, 414, or 514 is easily controlled with the variable attenuator. Consequently, the power amplifier circuit 310, 410, or 510 can be easily prevented from being damaged.

The signal adjustment unit 318, 418, or 518 of the power amplifier module 300, 400, or 500 includes a switch that performs switching as to whether to supply the signal RF12 (fourth signal) to the peaking amplifier 314, 414, or 514 (third amplifier) in accordance with the signal Dcont2 (second control signal). Thus, the operation point of the peaking amplifier 314, 414, or 514 can be easily controlled with a simple configuration.

The embodiments described above are provided to facilitate understanding of the present disclosure and thus should not be construed as limiting the present disclosure. The present disclosure can be modified or improved without necessarily departing from the gist thereof and encompasses equivalents thereof. That is, configurations obtained by a person skilled in the art appropriately making a design change to the embodiments are also included in the scope of the present disclosure as long as the configurations have the features of the present disclosure. Elements of the embodiments and arrangements of the elements are not limited to the illustrated ones and can be appropriately changed.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier module comprising:
a first amplifier configured to amplify a first signal, and to output a second signal;
a power splitter configured to split the second signal into a third signal and a fourth signal;
a second amplifier configured to amplify the third signal, and to output a fifth signal;
a third amplifier configured to amplify the fourth signal, and to output a sixth signal;
a phase shifter configured to receive the fifth signal, and to shift a phase of the fifth signal;
a combining circuit configured to combine the fifth signal phase-shifted by the phase shifter and the sixth signal, and to output an amplified signal of the second signal; and
a controller configured to output, based on an amplitude level of the first signal, a first control signal that controls a power level of the sixth signal output from the third amplifier,
wherein the first control signal is controlled based on a signal whose value is 0 or 1 and the signal is in response to the amplitude level of the first signal.

2. The power amplifier module according to claim 1, wherein the controller comprises a switch that selectively switches whether the sixth signal is output from the third amplifier, and
wherein a state of the switch is controlled based on the first control signal.

3. The power amplifier module according to claim 2, wherein a gain of the first amplifier is controlled based on the first control signal.

4. The power amplifier module according to claim 1, further comprising:
a first bias circuit configured to supply a bias current or a bias voltage to the third amplifier,
wherein the bias current or the bias voltage is controlled based on the first control signal.

5. The power amplifier module according to claim 1, further comprising:
a second bias circuit configured to supply a second bias current or a second bias voltage to the first amplifier,
wherein the second bias current or the second bias voltage is controlled based on the first control signal.

6. The power amplifier module according to claim 1, wherein:
the second amplifier is configured to amplify the third signal and to output the fifth signal when a power level of the second signal is greater than or equal to a first level, and
the third amplifier is configured to amplify the fourth signal and to output the sixth signal when the power level of the second signal is greater than or equal to a second level, the second level being greater than the first level.

7. The power amplifier module according to claim 1, wherein a gain of the second amplifier is controlled based on the first control signal.

8. A power amplifier module comprising:
a first amplifier configured to amplify a first signal, and to output a second signal;
a power splitter configured to split the second signal into a third signal and a fourth signal;
a second amplifier configured to amplify the third signal, and to output a fifth signal;
a third amplifier configured to amplify the fourth signal, and to output a sixth signal;
a phase shifter configured to receive the fifth signal, and to shift a phase of the fifth signal;
a combining circuit configured to combine the fifth signal phase-shifted by the phase shifter and the sixth signal, and to output an amplified signal of the second signal;
a signal adjustment circuit that is between the power splitter and the third amplifier, and that is configured to control a passing of the fourth signal through the signal adjustment circuit; and
an output circuit configured to output, based on a base current of the second amplifier, a second control signal to the signal adjustment circuit, the second control signal controlling the signal adjustment circuit,
wherein the signal adjustment circuit is configured to control the passing of the fourth signal based on the second control signal.

9. The power amplifier module according to claim 8, wherein the output circuit is configured to output the second control signal based on a bias current supplied to a base of the second amplifier.

10. The power amplifier module according to claim 8, wherein the output circuit is configured to output the second control signal based on the fifth signal, the fifth signal changing according to the base current of the second amplifier.

11. The power amplifier module according to claim 8, wherein the signal adjustment circuit comprises a variable attenuator configured to change current passing characteristics in accordance with the second control signal.

12. The power amplifier module according to claim 8, wherein the signal adjustment circuit comprises a switch configured to selectively supply the fourth signal to the third amplifier in accordance with the second control signal.

13. The power amplifier module according to claim 2, further comprising:
a first bias circuit configured to supply a bias current or a bias voltage to the third amplifier,
wherein the bias current or the bias voltage is controlled based on the first control signal.

14. The power amplifier module according to claim 2, further comprising:
a second bias circuit configured to supply a second bias current or a second bias voltage to the first amplifier,
wherein the second bias current or the second bias voltage is controlled based on the first control signal.

15. The power amplifier module according to claim 2, wherein:
the second amplifier is configured to amplify the third signal and to output the fifth signal when a power level of the second signal is greater than or equal to a first level, and
the third amplifier is configured to amplify the fourth signal and to output the sixth signal when the power level of the second signal is greater than or equal to a second level, the second level being greater than the first level.

16. The power amplifier module according to claim 3, further comprising:
a first bias circuit configured to supply a bias current or a bias voltage to the third amplifier,
wherein the bias current or the bias voltage is controlled based on the first control signal.

17. The power amplifier module according to claim 3, further comprising:
a second bias circuit configured to supply a second bias current or a second bias voltage to the first amplifier,
wherein the second bias current or the second bias voltage is controlled based on the first control signal.

18. The power amplifier module according to claim 9, wherein the signal adjustment circuit comprises a variable attenuator configured to change current passing characteristics in accordance with the second control signal.

19. The power amplifier module according to claim 9, wherein the signal adjustment circuit comprises a switch configured to selectively supply the fourth signal to the third amplifier in accordance with the second control signal.

20. The power amplifier module according to claim 10, wherein the signal adjustment circuit comprises a switch configured to selectively supply the fourth signal to the third amplifier in accordance with the second control signal.

* * * * *